United States Patent
Wada et al.

(10) Patent No.: US 10,396,163 B2
(45) Date of Patent: Aug. 27, 2019

(54) SILICON CARBIDE EPITAXIAL SUBSTRATE AND METHOD FOR MANUFACTURING SILICON CARBIDE SEMICONDUCTOR DEVICE

(71) Applicant: Sumitomo Electric Industries, Ltd., Osaka-shi (JP)

(72) Inventors: Keiji Wada, Itami (JP); Hironori Itoh, Itami (JP); Takemi Terao, Osaka (JP); Kenji Kanbara, Itami (JP); Taro Nishiguchi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/750,606

(22) PCT Filed: Aug. 4, 2016

(86) PCT No.: PCT/JP2016/072925
§ 371 (c)(1),
(2) Date: Feb. 6, 2018

(87) PCT Pub. No.: WO2017/064908
PCT Pub. Date: Apr. 20, 2017

(65) Prior Publication Data
US 2019/0019868 A1    Jan. 17, 2019

(30) Foreign Application Priority Data

Oct. 13, 2015   (JP) .................................. 2015-202012

(51) Int. Cl.
*H01L 29/15*    (2006.01)
*H01L 29/16*    (2006.01)
(Continued)

(52) U.S. Cl.
CPC ........ *H01L 29/1608* (2013.01); *C23C 16/325* (2013.01); *C30B 25/20* (2013.01);
(Continued)

(58) Field of Classification Search
CPC ............... H01L 29/1608; H01L 29/045; H01L 29/66068; H01L 29/7801; H01L 21/02378; H01L 21/02433; C30B 25/20
(Continued)

(56) References Cited

U.S. PATENT DOCUMENTS

2010/0233433 A1* 9/2010 Miyanaga ............... C30B 23/00
428/156
2013/0272951 A1* 10/2013 Hiura .................. H01L 21/0237
423/448
2016/0181312 A1   6/2016 Kadono et al.

FOREIGN PATENT DOCUMENTS

JP       2006-328455 A       12/2006
JP       2010-004065 A        1/2010
(Continued)

Primary Examiner — Tu-Tu V Ho
(74) Attorney, Agent, or Firm — Baker Botts L.L.P.; Michael A. Sartori

(57) ABSTRACT

A silicon carbide epitaxial substrate includes a silicon carbide single crystal substrate and a silicon carbide layer. The silicon carbide single crystal substrate has a first main surface. The silicon carbide layer is on the first main surface. The silicon carbide layer includes a second main surface opposite to a surface thereof in contact with the silicon carbide single crystal substrate. The second main surface has a maximum diameter of more than or equal to 100 mm. The second main surface includes an outer peripheral region which is within 3 mm from an outer edge of the second main surface, and a central region surrounded by the outer peripheral region. The central region has a haze of less than or equal to 75 ppm.

22 Claims, 16 Drawing Sheets

(51) Int. Cl.

| | |
|---|---|
| *C30B 25/20* | (2006.01) |
| *C30B 29/36* | (2006.01) |
| *H01L 21/02* | (2006.01) |
| *C23C 16/32* | (2006.01) |
| *H01L 29/04* | (2006.01) |
| *H01L 29/66* | (2006.01) |
| *H01L 29/78* | (2006.01) |

(52) U.S. Cl.
CPC .......... *C30B 29/36* (2013.01); *H01L 21/0262* (2013.01); *H01L 21/02378* (2013.01); *H01L 21/02433* (2013.01); *H01L 21/02529* (2013.01); *H01L 21/02576* (2013.01); *H01L 29/045* (2013.01); *H01L 29/66068* (2013.01); *H01L 29/7801* (2013.01)

(58) Field of Classification Search
USPC .......................................................... 257/77
See application file for complete search history.

(56) References Cited

FOREIGN PATENT DOCUMENTS

| JP | 2013-034007 A | 2/2013 |
|---|---|---|
| WO | 2014/076945 A1 | 5/2014 |

\* cited by examiner

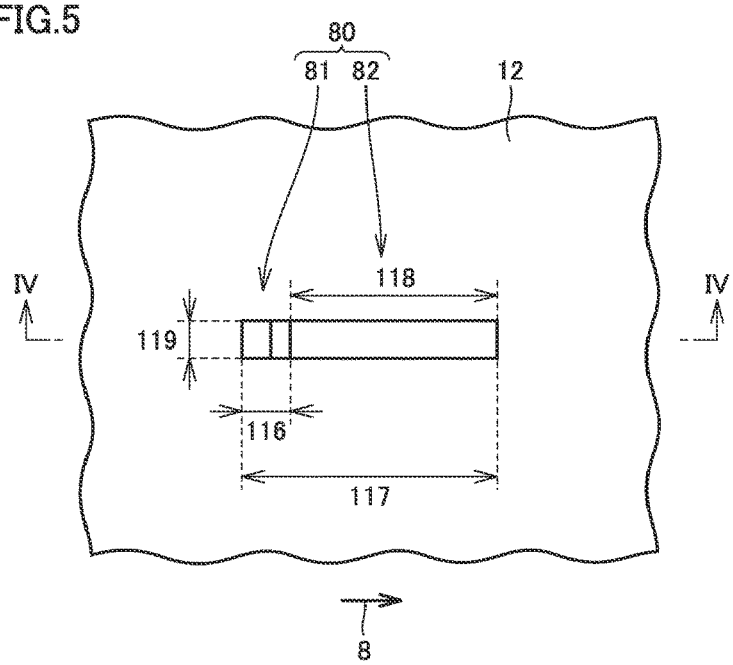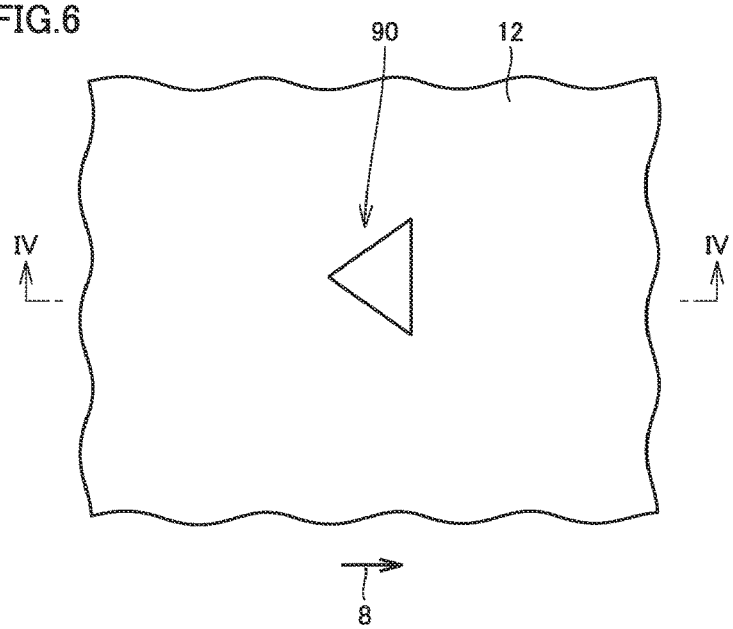

FIG.17
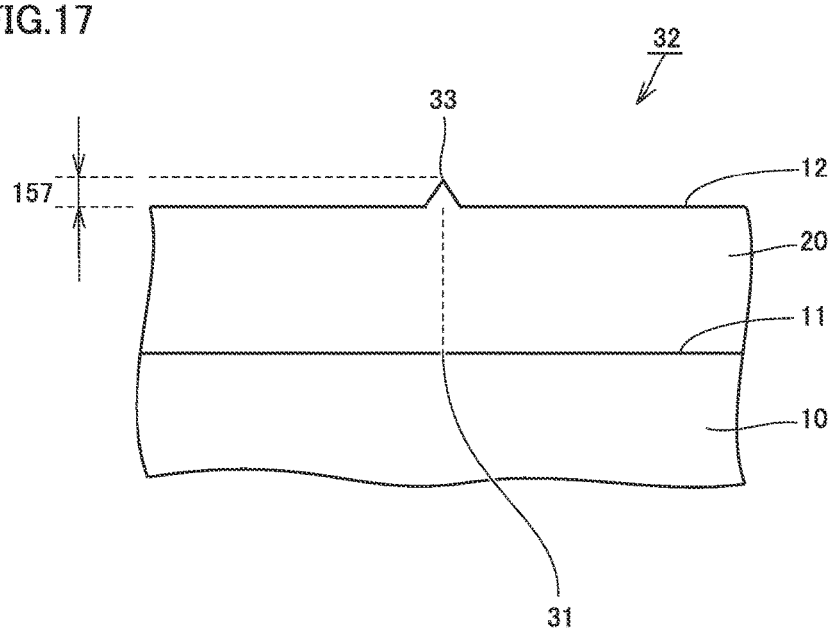
FIG.18
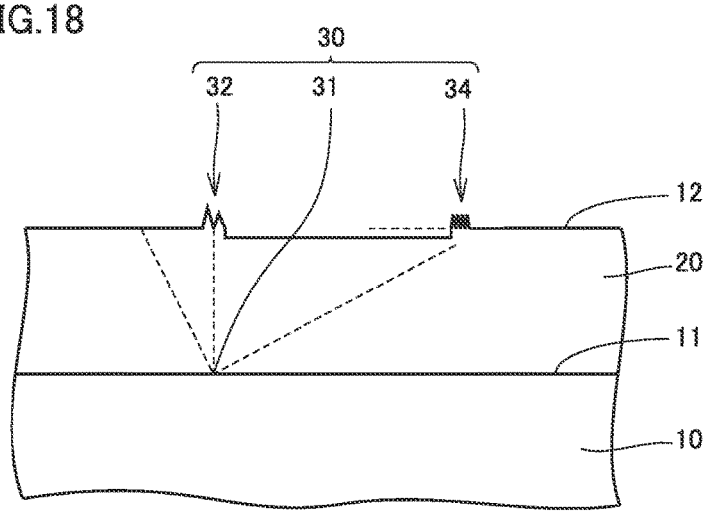
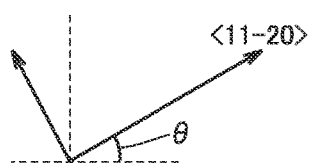

SILICON CARBIDE EPITAXIAL SUBSTRATE AND METHOD FOR MANUFACTURING SILICON CARBIDE SEMICONDUCTOR DEVICE

TECHNICAL FIELD

The present disclosure relates to a silicon carbide epitaxial substrate and a method for manufacturing a silicon carbide semiconductor device. The present application claims priority to Japanese Patent Application No. 2015-202012 filed on Oct. 13, 2015, the disclosure of which is incorporated herein by reference in its entirety.

BACKGROUND ART

Japanese Patent Laying-Open No. 2013-34007 (PTD 1) discloses a silicon carbide epitaxial substrate characterized by having no short step bunching.

CITATION LIST

Patent Document

PTD 1: Japanese Patent Laying-Open No. 2013-34007

SUMMARY OF INVENTION

A silicon carbide epitaxial substrate in accordance with the present disclosure includes a silicon carbide single crystal substrate and a silicon carbide layer. The silicon carbide single crystal substrate has a first main surface. The silicon carbide layer is on the first main surface. The silicon carbide layer includes a second main surface opposite to a surface thereof in contact with the silicon carbide single crystal substrate. The second main surface has a maximum diameter of more than or equal to 100 mm. The second main surface includes an outer peripheral region which is within 3 mm from an outer edge of the second main surface, and a central region surrounded by the outer peripheral region. The central region has a haze of less than or equal to 75 ppm.

BRIEF DESCRIPTION OF DRAWINGS

FIG. 5 is a schematic plan view showing a shallow pit.

FIG. 6 is a schematic plan view showing a deep pit.

FIG. 17 is a schematic cross sectional view taken along a line XVII-XVII in FIG. 16.

FIG. 18 is a schematic cross sectional view taken along a line XVIII-XVIII in FIG. 16.

DESCRIPTION OF EMBODIMENTS

Description of Embodiment of Present Disclosure

Figure 1:
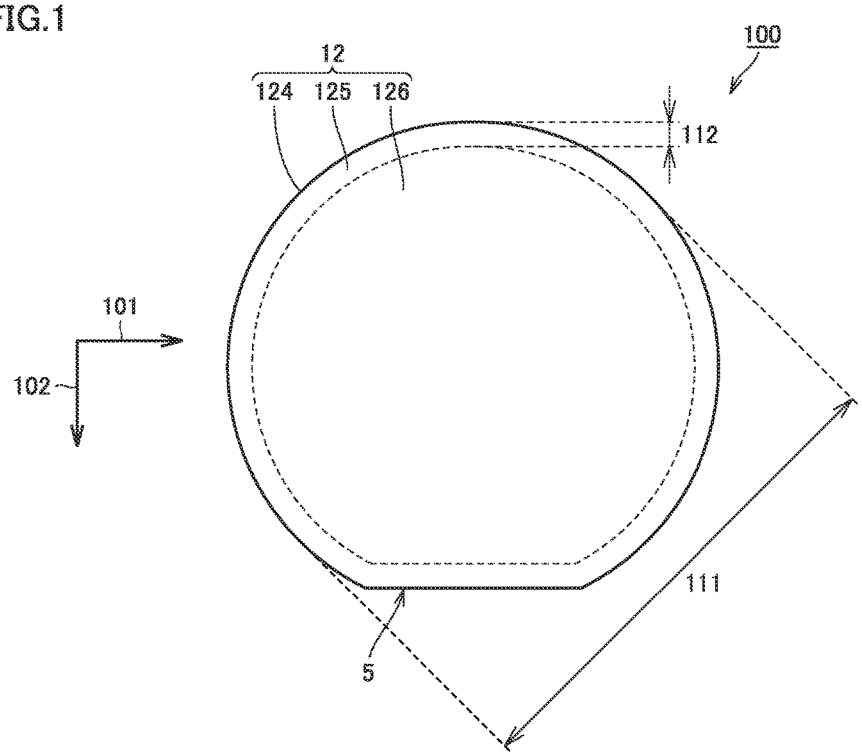
FIG. 1 is a schematic plan view showing a configuration of a silicon carbide epitaxial substrate in accordance with the present embodiment.

In the description below, identical or corresponding elements will be designated by the same reference numerals, and the same description thereof will not be repeated. Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "-" (bar) above a numeral, but is indicated by putting the negative sign before the numeral in the present specification. Further, in the description below, regarding crystal planes of silicon carbide (SiC), a (000-1) plane may be referred to as a "C (carbon) plane", and a (0001) plane may be referred to as a "Si (silicon) plane".

(1) A silicon carbide epitaxial substrate 100 in accordance with the present disclosure includes a silicon carbide single crystal substrate 10 and a silicon carbide layer 20. Silicon carbide single crystal substrate 10 has a first main surface 11. Silicon carbide layer 20 is on first main surface 11. Silicon carbide layer 20 includes a second main surface 12 opposite to a surface 14 thereof in contact with silicon carbide single crystal substrate 10. Second main surface 12 has a maximum diameter of more than or equal to 100 mm. Second main surface 12 includes an outer peripheral region 125 which is within 3 mm from an outer edge 124 of second main surface 12, and a central region 126 surrounded by outer peripheral region 125. Central region 126 has a haze of less than or equal to 75 ppm.

The reliability of an insulating film is considered to be related to the surface roughness of a silicon carbide epitaxial substrate on which the insulating film is formed. As indexes for quantifying the degree of the surface roughness, for example, an arithmetic average roughness (Ra), Sa obtained by three-dimensionally expanding Ra, and the like are known. For example, Sa can be measured by observing a surface of a silicon carbide epitaxial substrate with a white light interferometric microscope. The field of view for observation is 250 μm×250 μm, for example. That is, Sa and Ra are roughnesses measured at a local region in the surface of the silicon carbide epitaxial substrate, and thus they may not represent the roughness of the entire surface. Accordingly, a charge-to-breakdown ($Q_{BD}$), which is used as one index for the reliability of an insulating film, and the surface roughness such as Ra or Sa may not have a correlation therebetween.

Hence, the present inventors have focused on an index "haze" in order to evaluate the reliability of an insulating film. The haze is an index indicating the degree of scattering in a surface. Specifically, light such as a laser beam is emitted onto a surface of a silicon carbide epitaxial substrate, and scattered light of the light is observed. The haze is determined as a ratio of scattered light intensity to incident light intensity (unit: ppm). As a result of studies by the present inventors, it has been found that the value of the haze has a strong correlation with charge-to-breakdown $Q_{BD}$.

Furthermore, the present inventors have conducted a detailed investigation on the relation between the haze and charge-to-breakdown $Q_{BD}$. As a result, it has been found that charge-to-breakdown $Q_{BD}$ increases sharply when the haze becomes less than or equal to a certain value (specifically, less than or equal to 75 ppm). As charge-to-breakdown $Q_{BD}$ is larger, the insulating film has a higher reliability. That is, the present inventors have found that the reliability of an insulating film formed on a surface of a silicon carbide epitaxial substrate can be improved by setting the value of the haze of the surface to less than or equal to 75 ppm.

(2) In silicon carbide epitaxial substrate 100 in accordance with (1) described above, second main surface 12 may be a (0001) plane, or a plane inclined from the (0001) plane by less than or equal to 8°.

Silicon carbide epitaxial substrate 100 in accordance with (2) described above has silicon carbide layer 20 formed on a Si plane side of silicon carbide single crystal substrate 10. A carrier concentration in silicon carbide layer 20 is calculated as the sum of nitrogen derived from a gas supplied as a dopant and nitrogen derived from other than the gas. Of the nitrogen captured into silicon carbide layer 20, the nitrogen derived from other than the gas supplied as a dopant is called a background. The background is considered to be derived from residual nitrogen within a reaction chamber, for example.

In epitaxial growth on the Si plane side, the amount of change in background concentration with respect to the amount of change in C/Si ratio is greater, when compared with epitaxial growth on a C plane side. Accordingly, in the epitaxial growth on the Si plane side, the background can be easily reduced by changing the C/Si ratio. On the other hand, in the epitaxial growth on the Si plane side, it is necessary to enhance uniformity of the C/Si ratio in an in-plane direction in order to enhance uniformity of the background concentration in the in-plane direction. Further, when an epitaxial layer is formed on the Si plane side using conditions for a high C/Si ratio, there is a tendency that the background concentration in the silicon carbide layer is reduced, whereas surface flatness of the silicon carbide layer is worsened. That is, in the epitaxial growth on the Si plane side, it has been difficult to improve the surface flatness of the silicon carbide layer while improving in-plane uniformity of the carrier concentration in the silicon carbide layer.

According to silicon carbide epitaxial substrate 100 in accordance with the present embodiment, in the epitaxial growth on the Si plane side, the surface flatness of the silicon carbide layer can be improved while improving the in-plane uniformity of the carrier concentration in the silicon carbide layer, by using a manufacturing method described later.

(3) In silicon carbide epitaxial substrate 100 in accordance with (2) described above, in a direction parallel to second main surface 12, a ratio of a standard deviation of the carrier concentration to an average value of the carrier concentration in silicon carbide layer 20 may be less than or equal to 4%. The average value may be less than or equal to $2 \times 10^{16}$ $cm^{-3}$.

According to silicon carbide epitaxial substrate 100 in accordance with the present disclosure, the ratio of the standard deviation of the carrier concentration to the average value of the carrier concentration in a plane of silicon carbide layer 20 is less than or equal to 4%. The ratio is determined as a percentage of a value obtained by dividing the standard deviation (σ) of the carrier concentration by the average value (ave) of the carrier concentration. Hereinafter, the ratio (σ/ave) may be referred to as "in-plane uniformity". The in-plane uniformity indicates that, as its value is smaller, the carrier concentration is distributed more uniformly. It should be noted that the carrier concentration in the present application means an effective carrier concentration. For example, when the silicon carbide layer includes electrons and holes, the effective carrier concentration is calculated as an absolute value of a difference between electron density and hole density. A method for measuring the carrier concentration will be described later.

(4) In silicon carbide epitaxial substrate 100 in accordance with (2) or (3) described above, a groove portion 80 may be present in second main surface 12, groove portion 80 extending in one direction along second main surface 12, having a width in the one direction which is twice or more a width thereof in a direction perpendicular to the one direction, and having a maximum depth from second main surface 12 of less than or equal to 10 nm.

(5) In the silicon carbide epitaxial substrate in accordance with (4) described above, groove portion 80 may include a first groove portion 81, and a second groove portion 82 connected to first groove portion 81. First groove portion 81 may be at one end portion of groove portion 80 in the one direction. Second groove portion 82 may extend from first groove portion 81 along the one direction to reach the other end portion opposite to the one end portion, and may have a depth from the second main surface which is smaller than a maximum depth of first groove portion 81.

(6) In silicon carbide epitaxial substrate 100 in accordance with any of (2) to (5) described above, a pit 2 originating from a threading screw dislocation may be present in second main surface 12. Pit 2 may have an area density of less than or equal to 1000 cm$^{-2}$. Within pit 2, a maximum depth thereof from second main surface 12 may be more than or equal to 8 nm.

(7) In silicon carbide epitaxial substrate 100 in accordance with (6) described above, pit 2 may have an area density of less than or equal to 100 cm$^{-2}$.

(8) In silicon carbide epitaxial substrate 100 in accordance with (6) described above, pit 2 may have an area density of less than or equal to 10 cm$^{-2}$.

(9) In silicon carbide epitaxial substrate 100 in accordance with (6) described above, pit 2 may have an area density of less than or equal to 1 cm$^{-2}$.

(10) In silicon carbide epitaxial substrate 100 in accordance with any of (6) to (9) described above, within pit 2, a maximum depth thereof from second main surface 12 may be more than or equal to 20 nm.

(11) In silicon carbide epitaxial substrate 100 in accordance with any of (6) to (10) described above, pit 2 may have a planar shape including a first width 51 extending in a first direction, and a second width 52 extending in a second direction perpendicular to the first direction. First width 51 may be twice or more second width 52.

(12) In silicon carbide epitaxial substrate 100 in accordance with (1) described above, second main surface 12 may be a (000-1) plane, or a plane inclined from the (000-1) plane by less than or equal to 8°.

Silicon carbide epitaxial substrate 100 in accordance with (12) described above has silicon carbide layer 20 formed on the C plane side of silicon carbide single crystal substrate 10. In silicon carbide layer 20 formed on the C plane side, for example, improvement in channel mobility can be expected, when compared with silicon carbide layer 20 formed on the Si plane side. However, on the C plane side of silicon carbide single crystal substrate 10, it has been difficult to improve surface flatness while improving the in-plane uniformity of the carrier concentration, due to the reason described below.

As described above, in the epitaxial growth on the Si plane side, the amount of change in background concentration with respect to the amount of change in C/Si ratio is greater, when compared with the epitaxial growth on the C plane side. Specifically, in the epitaxial growth on the Si plane side, the background concentration can be reduced by about two orders of magnitude by changing the C/Si ratio in a range of 0.5 to 2. However, in the epitaxial growth on the C plane side, even when the C/Si ratio is changed in a similar manner, the change in the background concentration is less than one order of magnitude. Thus, in the epitaxial growth on the C plane side, it is difficult to reduce the background by the same technique as that for the Si plane side. Accordingly, in order to improve the in-plane uniformity of the carrier concentration, it is necessary to sufficiently reduce residual nitrogen which can be the background.

The residual nitrogen is considered to be derived from nitrogen adsorbed to a peripheral member arranged around a silicon carbide single crystal substrate within a reaction chamber of a film forming device. Therefore, the residual nitrogen is considered to have a greater influence on an outer peripheral portion of the silicon carbide single crystal substrate, than a central portion thereof. The residual nitrogen can be reduced by so-called baking, for example. Desorption of the nitrogen adsorbed to the peripheral member can be promoted, for example, by increasing the temperature within the reaction chamber and decreasing the pressure within the reaction chamber during growth. Thereby, an absolute value of a residual nitrogen concentration can be reduced. On the other hand, it becomes difficult to keep a uniform temperature distribution in a plane of the silicon carbide single crystal substrate. When the temperature distribution becomes nonuniform, the C/Si ratio in the plane of the silicon carbide single crystal substrate also becomes nonuniform. As a result, it is considered that the in-plane uniformity of the carrier concentration in the silicon carbide layer and the surface flatness of the silicon carbide layer are worsened.

From the above consideration, it is considered effective to uniformly distribute the C/Si ratio in the plane of the silicon carbide single crystal substrate, in order to improve the in-plane uniformity of the carrier concentration in the silicon carbide layer and to improve the surface flatness of the silicon carbide layer, in the epitaxial growth on the C plane side.

According to silicon carbide epitaxial substrate 100 in accordance with the present embodiment, also in the epitaxial growth on the C plane side, the surface flatness of the silicon carbide layer can be improved while improving the in-plane uniformity of the carrier concentration in the silicon carbide layer, by using the manufacturing method described later.

(13) In silicon carbide epitaxial substrate 100 in accordance with (12) described above, in the direction parallel to second main surface 12, the ratio of the standard deviation of the carrier concentration to the average value of the carrier concentration in silicon carbide layer 20 may be less than or equal to 5%. The average value may be less than or equal to $2 \times 10^{16}$ cm$^{-3}$.

(14) In silicon carbide epitaxial substrate 100 in accordance with (13) described above, the ratio may be less than or equal to 3%.

(15) In silicon carbide epitaxial substrate 100 in accordance with (13) described above, the ratio may be less than or equal to 2%.

(16) In silicon carbide epitaxial substrate 100 in accordance with (13) described above, the ratio may be less than or equal to 1%.

(17) In silicon carbide epitaxial substrate 100 in accordance with any of (12) to (16) described above, in second main surface 12, trapezoidal defects 30, which are trapezoidal depressions, may have an area density of less than or equal to 0.5 cm$^{-2}$, trapezoidal defects 30 may each include an upper base portion 32 and a lower base portion 34 intersecting with a <11-20> direction when viewed in plan view, upper base portion 32 may have a width of more than or equal to 0.1 μm and less than or equal to 100 lower base portion 34 may have a width of more than or equal to 50 μm and less than or equal to 5000 upper base portion 32 may include a protruding portion 33, and lower base portion 34 may include a plurality of step bunchings 35.

(18) In silicon carbide epitaxial substrate 100 in accordance with any of (12) to (17) described above, in second main surface 12, triangular defects 40 may have an area density of less than or equal to 0.5 cm$^{-2}$.

(19) In silicon carbide epitaxial substrate 100 in accordance with any of (12) to (18) described above, silicon carbide epitaxial substrate 100 may have a bow of less than or equal to 50 The "bow" is a value defined by "ASTM (American Society for Testing and Materials) F534".

(20) In silicon carbide epitaxial substrate 100 in accordance with any of (1) to (19) described above, the maximum diameter may be more than or equal to 150 mm.

(21) In silicon carbide epitaxial substrate 100 in accordance with any of (1) to (20) described above, silicon carbide layer 20 may have a thickness of more than or equal to 5 μm.

(22) A method for manufacturing a silicon carbide semiconductor device 300 in accordance with the present disclosure includes the steps of preparing silicon carbide epitaxial substrate 100 in accordance with any of (1) to (21) described above, and processing silicon carbide epitaxial substrate 100.

Details of Embodiment of Present Disclosure

Hereinafter, one embodiment of the present disclosure (hereinafter also referred to as the "present embodiment") will be described, although the present embodiment is not limited thereto.

(Silicon Carbide Epitaxial Substrate)

Figure 2:
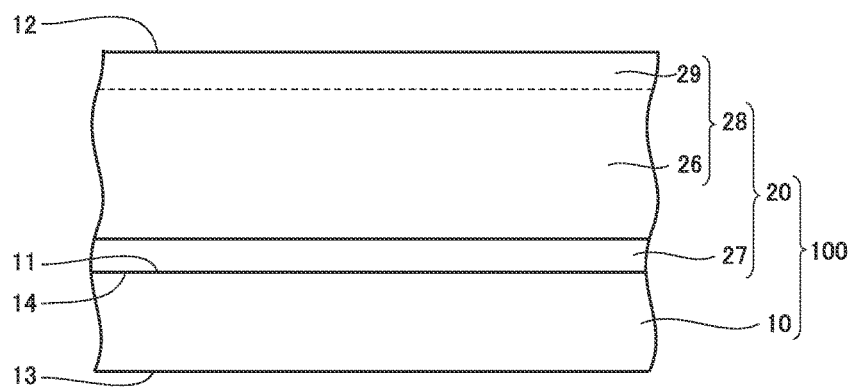
FIG. 2 is a schematic cross sectional view showing the configuration of the silicon carbide epitaxial substrate in accordance with the present embodiment.

As shown in FIGS. 1 and 2, silicon carbide epitaxial substrate 100 in accordance with the present embodiment has silicon carbide single crystal substrate 10 and silicon carbide layer 20. Silicon carbide single crystal substrate 10 includes first main surface 11, and a third main surface 13 opposite to first main surface 11. Silicon carbide layer 20 includes fourth main surface 14 in contact with silicon carbide single crystal substrate 10, and second main surface 12 opposite to fourth main surface 14. As shown in FIG. 1, silicon carbide epitaxial substrate 100 may have a first flat 5 extending in a first direction 101. Silicon carbide epitaxial substrate 100 may have a second flat (not shown) extending in a second direction 102. First direction 101 is a <11-20> direction, for example. Second direction 102 is a <1-100> direction, for example.

Silicon carbide single crystal substrate 10 (hereinafter may be simply referred to as a "single crystal substrate") is composed of a silicon carbide single crystal. The polytype of the silicon carbide single crystal is 4H—SiC, for example. 4H—SiC is more excellent than other polytypes in terms of electron mobility, dielectric strength, and the like. Silicon carbide single crystal substrate 10 contains an n type impurity such as nitrogen, for example. The conductivity type of silicon carbide single crystal substrate 10 is n type, for example. First main surface 11 is, for example, a {0001} plane, or a plane inclined from the {0001} plane by less than or equal to 8°. When first main surface 11 is inclined from the {0001} plane, the inclination direction of a normal to first main surface 11 is the <11-20> direction, for example.

Silicon carbide layer 20 is an epitaxial layer formed on silicon carbide single crystal substrate 10. Silicon carbide layer 20 is on first main surface 11. Silicon carbide layer 20 is in contact with first main surface 11. Silicon carbide layer 20 contains an n type impurity such as nitrogen, for example. The conductivity type of silicon carbide layer 20 is n type, for example. The concentration of the n type impurity contained in silicon carbide layer 20 may be higher than the concentration of the n type impurity contained in silicon carbide single crystal substrate 10. Silicon carbide layer 20 has a thickness of more than or equal to 5 for example. The thickness of silicon carbide layer 20 may be more than or equal to 10 more than or equal to 15 or more than or equal to 20 The upper limit of the thickness of silicon carbide layer 20 is not particularly limited. The upper limit of the thickness of silicon carbide layer 20 may be 150 for example.

As shown in FIG. 1, second main surface 12 has a maximum diameter 111 of more than or equal to 100 mm. Maximum diameter 111 may be more than or equal to 150 mm, more than or equal to 200 mm, or more than or equal to 250 mm. The upper limit of maximum diameter 111 is not particularly limited. The upper limit of maximum diameter 111 may be 300 mm, for example.

Second main surface 12 may be, for example, a {0001} plane, or a plane inclined from the {0001} plane by less than or equal to 8°. Specifically, second main surface 12 may be a (0001) plane, or a plane inclined from the (0001) plane by less than or equal to 8°. The inclination direction (off direction) of a normal to second main surface 12 may be the <11-20> direction, for example. The inclination angle (off angle) from the {0001} plane may be more than or equal to 1°, or more than or equal to 2°. The off angle may be less than or equal to 7°, or less than or equal to 6°.

As shown in FIG. 1, second main surface 12 includes outer peripheral region 125, and central region 126 surrounded by outer peripheral region 125. Outer peripheral region 125 is a region which is within 3 mm from outer edge 124 of second main surface 12. In other words, in a radial direction of second main surface 12, a distance 112 between outer edge 124 and a boundary between outer peripheral region 125 and central region 126 is 3 mm.

(Haze)

Central region 126 has a haze of less than or equal to 75 ppm. The haze may be less than or equal to 50 ppm, less than or equal to 25 ppm, or less than or equal to 20 ppm. The haze having a smaller value is more preferable.

The haze is measured using SICA manufactured by Lasertec Corporation, for example. Specifically, a maximum haze value in rectangular regions obtained by dividing one field of view for observation measuring 1.8 mm±0.2 mm per side into 64 regions is derived. The one field of view for observation includes an imaging region of 1024×1024 pixels. The maximum haze value is obtained by calculating horizontal and vertical edge intensity of the field of view for observation with a Sobel filter, and deriving an absolute value thereof. Through the above procedure, the maximum haze values in respective fields of view for observation are observed in the entire surface of central region 126, which is a region of second main surface 12 other than outer peripheral region 125. An average value of the maximum haze values in the respective fields of view for observation is defined as a haze value in central region 126.

(Bow)

Silicon carbide epitaxial substrate 100 is desirably a substrate having less warpage. In other words, second main surface 12 is desirably substantially flat as shown in FIG. 2. Specifically, silicon carbide epitaxial substrate 100 may have a bow of less than or equal to 50 The bow may be less than or equal to 40 less than or equal to 30 or less than or equal to 20 μm.

(In-Plane Uniformity of Carrier Concentration)

Silicon carbide layer 20 contains nitrogen, for example, as a dopant. In silicon carbide layer 20, the average value of the carrier concentration may be less than or equal to $2\times10^{16}$ cm$^{-3}$. The average value of the carrier concentration may be less than or equal to $1\times10^{16}$ cm$^{-3}$, less than or equal to $9\times10^{15}$ cm$^{-3}$, or less than or equal to $8\times10^{15}$ cm$^{-3}$. Further, the average value of the carrier concentration may be more than or equal to $1\times10^{15}$ cm$^{-3}$, more than or equal to $5\times10^{15}$ cm$^{-3}$, or more than or equal to $6\times10^{15}$ cm$^{-3}$, for example.

In the direction parallel to second main surface 12, the ratio (σ/ave) of the standard deviation of the carrier concentration to the average value of the carrier concentration in silicon carbide layer 20 may be less than or equal to 4%. The ratio having a smaller value is more preferable, and the ratio is ideally zero. The ratio may be less than or equal to 3%, less than or equal to 2%, or less than or equal to 1%.

Figure 3:
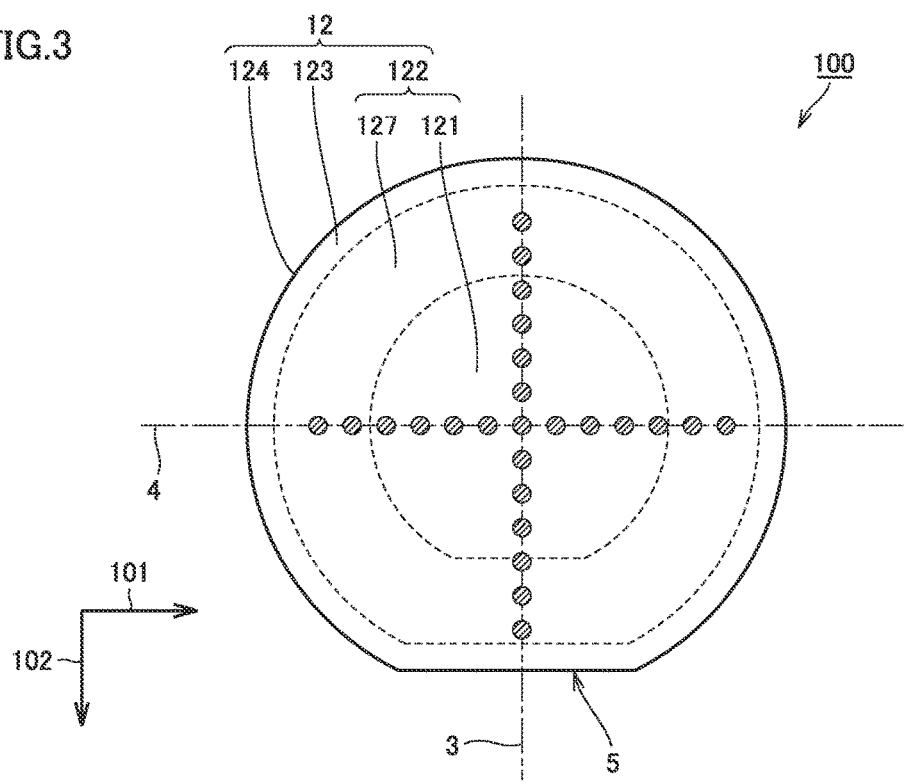
FIG. 3 is a schematic plan view showing positions for measuring a carrier concentration.

Next, the method for measuring the carrier concentration will be described. The carrier concentration is measured with a mercury probe-type C-V measurement device, for example. The probe has an area of 0.01 cm$^2$, for example. Second main surface 12 includes an outer peripheral region 123 which is within 5 mm from outer edge 124, and a central region 122 surrounded by outer peripheral region 123. The carrier concentration is measured in central region 122. In other words, the carrier concentration in outer peripheral region 123 is not measured. For example, in central region 122, positions obtained by substantially equally dividing a straight line which passes through the center of second main surface 12 and is parallel to first direction 101 into 12 parts are defined as measurement positions. Similarly, positions obtained by substantially equally dividing a straight line which passes through the center of second main surface 12 and is parallel to second direction 102 into 12 parts are defined as measurement positions. The intersection of the two straight lines is defined as one of the measurement positions. As shown in FIG. 3, the carrier concentration is measured at a total of 25 measurement positions in central region 122. An average value and a standard deviation of the carrier concentration at the total of 25 measurement positions are calculated.

As shown in FIG. 2, silicon carbide layer 20 includes a surface layer region 29 and a bottom layer region 26. Surface layer region 29 is a region which extends from second main surface 12 toward fourth main surface 14 in a direction perpendicular to second main surface 12, and is within 10 μm from second main surface 12. The measurement depth is adjusted by an applied voltage. Bottom layer region 26 is a region sandwiched between surface layer region 29 and a buffer layer 27. The carrier concentration is measured in surface layer region 29. Measurement data is plotted, with 1/C$^2$ being indicated on the axis of ordinates and V being indicated on the axis of abscissas. The carrier concentration is estimated from the inclination of a straight line of the measurement data.

(Shallow Pit)

Figure 4:
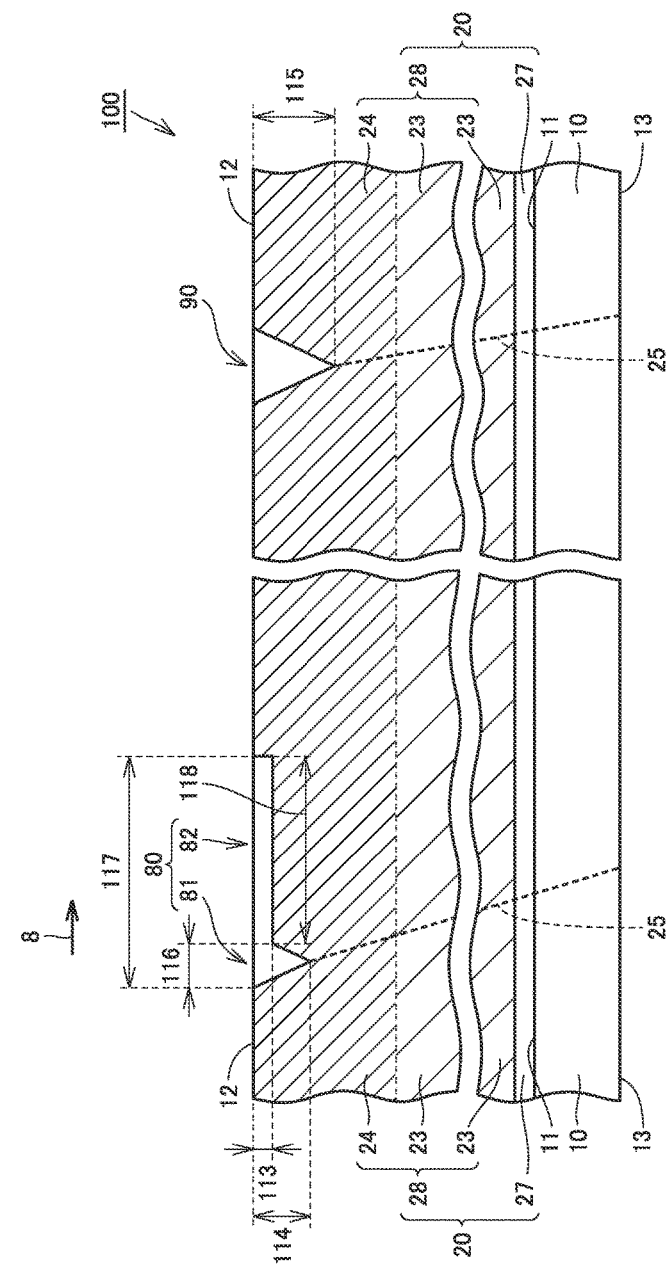
FIG. 4 is a schematic cross sectional view taken along a line IV-IV in FIG. 5 (on the left side) and a schematic cross sectional view taken along a line IV-IV in FIG. 6 (on the right side).

As shown in FIGS. 4 and 5, groove portion 80 may be present in second main surface 12. Groove portion 80 extends in one direction along second main surface 12 when viewed in a plan view of second main surface 12 (i.e., a field of view viewed along the direction perpendicular to second main surface 12). More specifically, groove portion 80 extends along a step-flow growth direction 8 which is along the off direction of the off angle relative to the (0001) plane. That is, groove portion 80 extends along a direction within a range of less than or equal to ±5° relative to the <11-20> direction, or along a direction within a range of less than or equal to ±5° relative to a <01-10> direction.

As shown in FIG. 5, groove portion 80 has a width 117 in the one direction, which is twice or more, and preferably five times or more, a width 119 thereof in a direction perpendicular to the one direction. Width 117 is more than or equal to 15 μm and less than or equal to 50 and preferably more than or equal to 25 μm and less than or equal to 35 μm. Width 119 is more than or equal to 1 μm and less than or equal to 5 μm, and preferably more than or equal to 2 μm and less than or equal to 3 μm.

As shown in FIG. 4, groove portion 80 extends from a threading dislocation 25 present in silicon carbide layer 20, along step-flow growth direction 8 which is along the off direction of the off angle. More specifically, groove portion 80 includes first groove portion 81 formed on threading dislocation 25, and second groove portion 82 connected to first groove portion 81 and extending from first groove portion 81 along step-flow growth direction 8.

First groove portion 81 is formed at one end portion (left end portion in FIG. 4) of groove portion 80 in step-flow growth direction 8. Further, first groove portion 81 has a maximum depth 114 from second main surface 12 of less than or equal to 10 nm. Maximum depth 114 is the maximum depth in the entire groove portion 80. First groove portion 81 has a width 116, which is preferably less than or equal to 1 μm, and more preferably less than or equal to 0.5 μm.

As shown in FIG. 4, second groove portion 82 extends from its portion connected with first groove portion 81 to reach the other end portion (right end portion in FIG. 4) opposite to the one end portion. In other words, second groove portion 82 extends from first groove portion 81 along one direction 8 to reach the other end portion opposite to the one end portion. Second groove portion 82 has a depth 113 from second main surface 12 which is smaller than maximum depth 114 of first groove portion 81. More specifically, second groove portion 82 extends along step-flow growth direction 8 while maintaining the depth shallower than maximum depth 114 of first groove portion 81. Depth 113 is preferably less than or equal to 3 nm, more preferably less than or equal to 2 nm, and further preferably less than or equal to 1 nm. Further, second groove portion 82 has a width 118 which is more than or equal to 20 μm, for example, and is preferably more than or equal to 25 μm.

Groove portion 80 in second main surface 12 has an area density of more than or equal to 10/mm$^2$, for example. The area density may be more than or equal to 100/mm$^2$. The upper limit of the area density may be 1000/mm$^2$.

As shown in FIGS. 4 and 6, a pit 90 may be provided in second main surface 12. As shown in FIG. 4, pit 90 originates from threading dislocation 25 extending from silicon carbide single crystal substrate 10 into silicon carbide layer 20. Pit 90 has a maximum depth 115, which is more than 10 nm, and more specifically more than 20 nm. As shown in FIG. 6, pit 90 may have a triangular shape when viewed in plan view (i.e., when viewed from the direction perpendicular to second main surface 12).

(Deep Pit)

Figure 7:
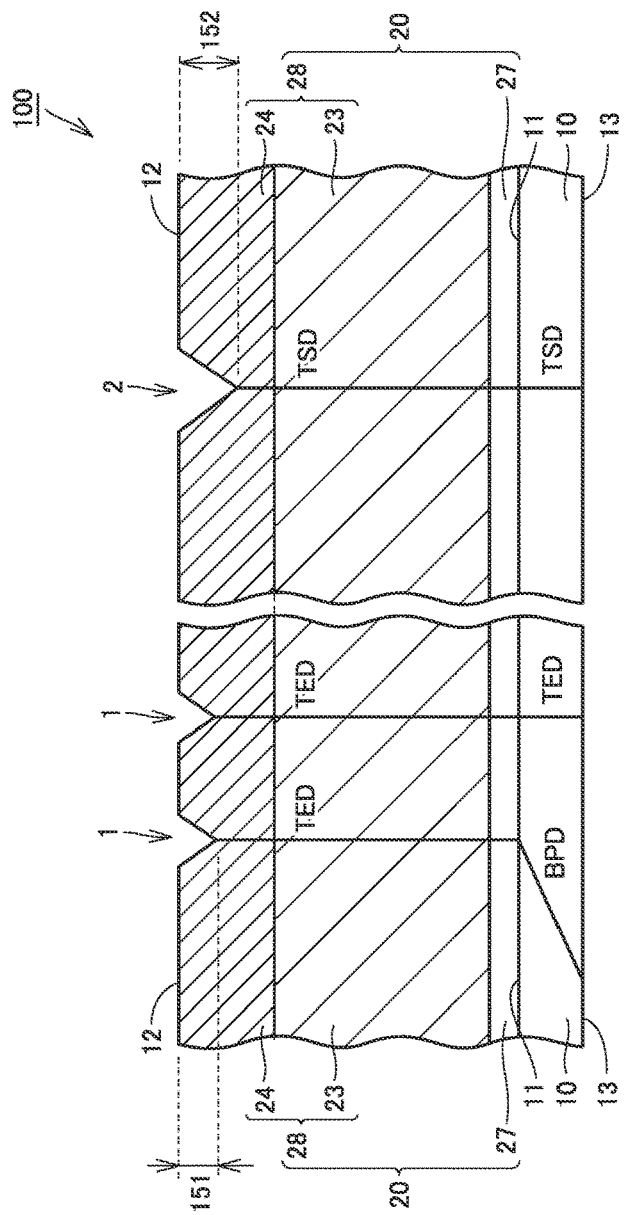
FIG. 7 is a schematic cross sectional view showing configurations of the shallow pit (on the left side) and the deep pit (on the right side).

As shown in FIG. 7, a shallow pit 1 having a maximum depth of less than 8 nm and a deep pit 2 having a maximum depth of more than or equal to 8 nm may be present in second main surface 12. These pits may originate from a threading screw dislocation (TSD), a threading edge dislocation (TED), and the like in the epitaxial layer. Pit 2 is a groove-like microscopic defect. Pit 2 is considered to originate from a threading screw dislocation, a threading edge dislocation, and a threading composite dislocation in silicon carbide layer 20. In the specification of the present application, a threading composite dislocation containing a screw dislocation component is also regarded as a threading screw dislocation.

In second main surface 12, pit 2 originating from a threading screw dislocation and having a maximum depth 152 of more than or equal to 8 nm may have an area density of less than or equal to 1000 cm$^{-2}$. The lower the area density of pit 2 is, the more it is desirable. The area density of the pit may be less than or equal to 100 cm$^{-2}$, less than or equal to 10 cm$^{-2}$, or less than or equal to 1 cm$^{-2}$. In second main surface 12, pit 1 originating from a threading edge dislocation and having a maximum depth of less than 8 nm may be present.

In second main surface 12, pit 2 originating from a threading screw dislocation and having maximum depth 152 of more than or equal to 20 nm may have an area density of less than or equal to 1000 cm$^{-2}$. Pit 2 having the maximum depth of more than or equal to 20 nm can also be detected by shape definition in a defect inspection device described later. The area density of pit 2 originating from a threading screw dislocation and having the maximum depth of more than or equal to 20 nm may be less than or equal to 100 cm$^{-2}$, less than or equal to 10 cm$^{-2}$, or less than or equal to 1 cm$^{-2}$.

Figure 8:
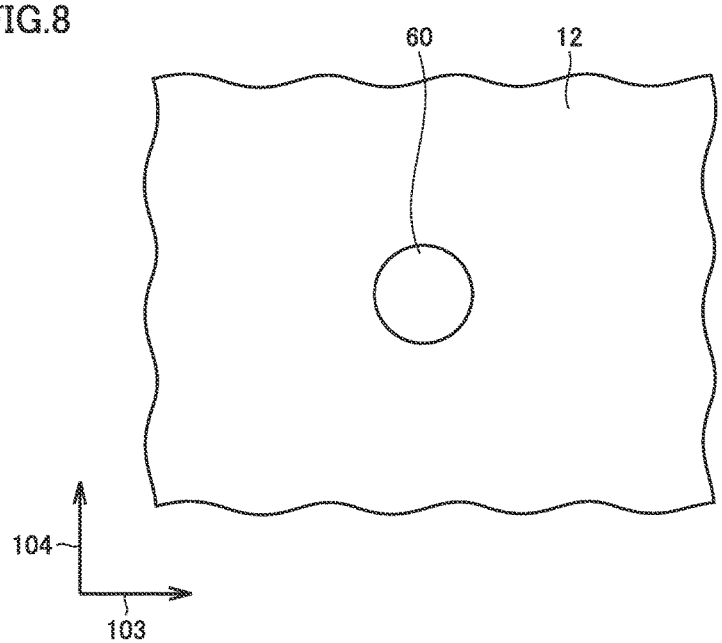
FIG. 8 is a schematic plan view showing a configuration of a first example of the deep pit.
Figure 9:
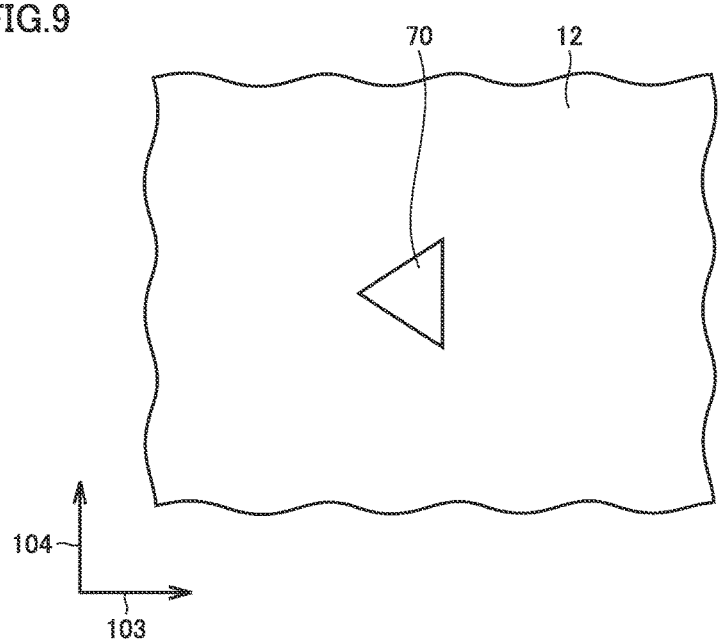
FIG. 9 is a schematic plan view showing a configuration of a second example of the deep pit.
Figure 10:
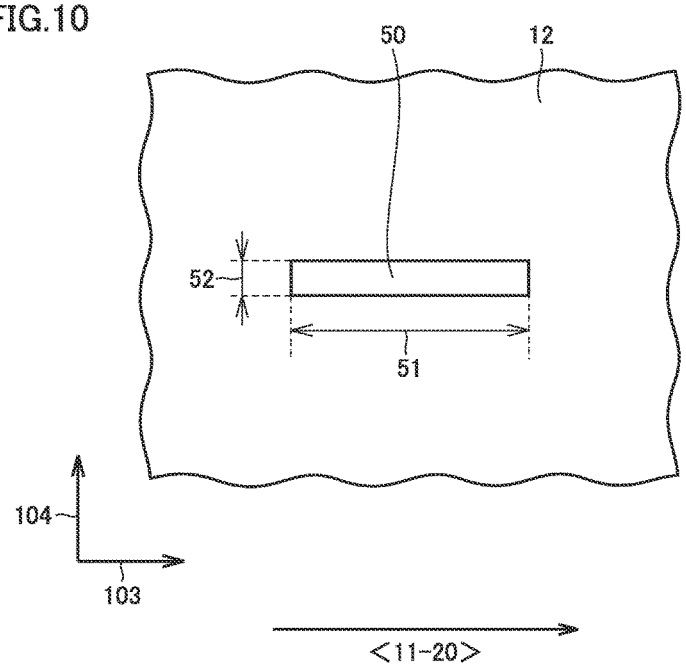
FIG. 10 is a schematic plan view showing a configuration of a third example of the deep pit.

FIGS. 8 to 10 are schematic views each showing an exemplary planar shape of pit 2. The planar shape of pit 2 may have a circular shape such as a circular pit 60 shown in FIG. 8, a triangular shape such as a triangular pit 70 shown in FIG. 9, or a bar-like shape such as a bar-like pit 50 shown in FIG. 10.

Bar-like pit 50 may have first width 51 extending in a third direction 103, and second width 52 extending in a fourth direction 104 perpendicular to third direction 103. First width 51 is twice or more second width 52. First width 51 may be five times or more second width 52. First width 51 may be more than or equal to 5 μm, or more than or equal to 25 μm, for example. First width 51 may be less than or equal to 50 μm, or less than or equal to 35 μm, for example. Second width 52 may be more than or equal to 1 μm, or more than or equal to 2 μm, for example. Second width 52 may be less than or equal to 5 μm, or less than or equal to 4 μm, for example. Third direction 103 may be the <11-20> direction, or the <01-10> direction, for example.

(Method for Measuring Pit)

Whether or not a pit originates from a threading screw dislocation can be confirmed by an etch pit method or an X-ray topography method. When silicon carbide layer 20 is formed on a (0001) plane side of silicon carbide single crystal substrate 10, the etch pit method is used. With the etch pit method, a pit originating from a threading screw dislocation can be distinguished for example as described below. It should be noted that etching conditions shown herein are merely an example, and the etching conditions may be changed depending on the thickness of the epitaxial layer, doping concentration, and the like, for example. The following conditions assume a case where the epitaxial layer has a thickness of about 10 μm to 50 μm.

A potassium hydroxide (KOH) melt is used for etching. The temperature of the KOH melt is set to about 500 to 550° C. The etching time is set to about 5 to 10 minutes. After the etching, second main surface 12 is observed using a Nomarski differential interference microscope. A pit originating from a threading screw dislocation forms a larger etch pit, when compared with a pit originating from a threading edge dislocation. The etch pit originating from a threading screw dislocation has a hexagonal planar shape, for example, and a diagonal line of a hexagon typically has a length of about 30 to 50 μm. The etch pit originating from a threading edge dislocation has a hexagonal planar shape, for example, and is smaller than the etch pit originating from a threading screw dislocation. In the etch pit originating from a threading edge dislocation, a diagonal line of a hexagon typically has a length of about 15 to 20 μm.

When silicon carbide layer 20 is formed on a (000-1) plane side of silicon carbide single crystal substrate 10, the X-ray topography method is used. When the silicon carbide layer has a thickness of about 10 μm to 50 μm, a diffraction vector g may be set as g=11-28, and a penetration length may be set to about 20 μm. A threading screw dislocation is observed with a stronger contrast, when compared with a threading edge dislocation.

The maximum depth from the main surface in the pit can be measured using an AFM (Atomic Force Microscope). As the AFM, for example, "Dimension 300" manufactured by Veeco or the like can be adopted. As a cantilever for the AFM, "NCHV-10V" manufactured by Bruker or the like is suitable. Conditions for the AFM can be set as follows. The measurement mode is set to a tapping mode. The measurement region in the tapping mode is set to a square measuring 5 μm per side. For sampling in the tapping mode, the scanning speed within the measurement region is set to 5 seconds for one cycle, the number of scan lines is set to 512, and the number of measurement points for each scan line is set to 512 points. Controlled displacement of the cantilever is set to 15.50 nm.

The shape of the "groove portion" can be specified by observing second main surface 12 using a defect inspection device including a confocal differential interference microscope. As the defect inspection device including a confocal differential interference microscope, WASAVI series "SICA 6X" manufactured by Lasertec Corporation or the like can be used. An objective lens is set to have a magnification of 10 times. A threshold value of detection sensitivity of the defect inspection device is determined using the standard sample described above. Thereby, the shape of the "groove portion" formed in a measured sample can be evaluated quantitatively by using the defect inspection device.

The area density of the pit having a maximum depth from second main surface 12 of more than or equal to 8 nm is measured using AFM measurement and the defect inspection device together. The shape of a pit having a maximum depth of more than or equal to 8 nm is defined by associating depth data in the AFM measurement with a pit image in confocal microscope measurement. The entire surface of second main surface 12 is analyzed to detect any pit which satisfies the definition. The area density of the pit can be calculated by dividing the number of the detected pits by a measurement area. It should be noted that, generally, the entire surface in this measurement does not include a region which is not utilized for a semiconductor device. The region which is not utilized for a semiconductor device is, for example, outer peripheral region 125 which is within 3 mm from outer edge 124 of second main surface 12.

(Film Forming Device)

Next, a configuration of a film forming device 200 used for a method for manufacturing silicon carbide epitaxial substrate 100 in accordance with the present embodiment will be described.

Figure 11:
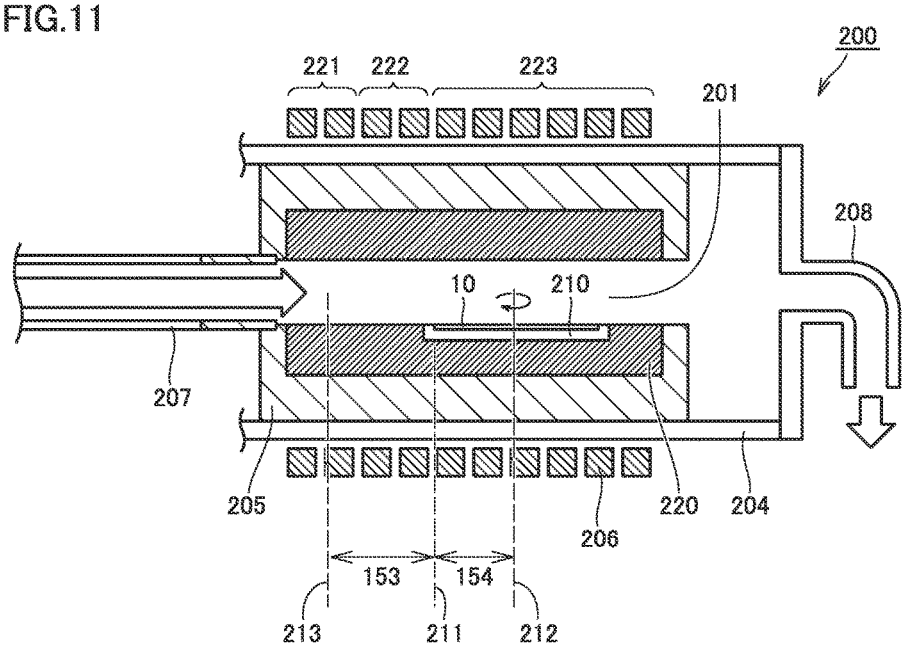
FIG. 11 is a schematic see-through side view showing a configuration of a device for manufacturing the silicon carbide epitaxial substrate in accordance with the present embodiment.

As shown in FIG. 11, film forming device 200 is a hot wall-type CVD (Chemical Vapor Deposition) device, for example. Film forming device 200 mainly has a heating element 220, a quartz tube 204, a heat insulator 205, and an induction heating coil 206. A space surrounded by heating element 220 is a reaction chamber 201. Reaction chamber 201 is provided with a susceptor plate 210 for holding silicon carbide single crystal substrate 10. Susceptor plate 210 is rotatable. Silicon carbide single crystal substrate 10 is placed on susceptor plate 210 with first main surface 11 facing upward.

Heating element 220 is made of graphite, for example. Induction heating coil 206 is wound around an outer periphery of quartz tube 204. By supplying a predetermined alternating current to induction heating coil 206, heating element 220 is heated. Thereby, reaction chamber 201 is heated.

Film forming device 200 further has a gas inlet 207 and a gas outlet 208. Gas outlet 208 is connected to an exhaust pump not shown. Arrows in FIG. 11 indicate flow of gas. A carrier gas, a source material gas, and a doping gas are introduced from gas inlet 207 into reaction chamber 201, and are exhausted from gas outlet 208. The pressure within reaction chamber 201 is adjusted in accordance with a balance between the amount of the supplied gases and the amount of the exhausted gases. Hereinafter, matters to be taken into consideration in the manufacturing method of the present disclosure will be described.

(Arrangement of Susceptor Plate)

Generally, susceptor plate 210 and single crystal substrate 10 are arranged at substantially the center in an axial direction of reaction chamber 201. In the present disclosure, susceptor plate 210 and single crystal substrate 10 may be arranged on a downstream side, that is, on a side closer to gas outlet 208, relative to the center of reaction chamber 201, in order to sufficiently proceed a decomposition reaction of the source material gas until the source material gas reaches single crystal substrate 10. Thereby, it is expected that the C/Si ratio will be uniformly distributed in the plane of the single crystal substrate.

In the present disclosure, a position at which the decomposition reaction of a Si source gas, of the source material gas, is predicted to become significant is referred to as a decomposition point 213 (see FIG. 11). At decomposition point 213, the amount of a Si gas generated by thermal decomposition of the Si source gas increases sharply. Beyond decomposition point 213, the amount of the Si gas gradually decreases toward the downstream side. In contrast, the amount of a C gas generated by thermal decomposition of a C source gas does not exhibit a maximum value and decreases monotonically around decomposition point 213. Therefore, the actual C/Si ratio in the plane of single crystal substrate 10 varies depending on the arrangement of single crystal substrate 10. The actual C/Si ratio used herein does not refer to a C/Si ratio which is simply calculated from the flow rate of the Si source gas and the flow rate of the C source gas, but refers to a ratio of the number of C atoms contained in the C gas generated by thermal decomposition to the number of Si atoms contained in the Si gas generated by thermal decomposition.

If a sufficient distance is not provided between decomposition point 213 and single crystal substrate 10, there arises a significant difference in C/Si ratio between the outer peripheral portion of the single crystal substrate and the central portion of the single crystal substrate. Thus, it is conceivable that the amount of captured N varies in the plane of silicon carbide layer 20, and the in-plane uniformity of the carrier concentration is deteriorated. As described above, it is desirable to provide a sufficient distance between decomposition point 213 and single crystal substrate 10. A distance 153 (see FIG. 11) between decomposition point 213 and single crystal substrate 10 may be set to more than or equal to about 30 mm and less than or equal to about 150 mm, for example.

Similarly, if ammonia gas is not sufficiently thermally decomposed on an upstream side of single crystal substrate 10, the amount of N generated on single crystal substrate 10 by the thermal decomposition of the ammonia gas varies. Accordingly, it is desirable to provide a sufficient distance between a decomposition point for the ammonia gas and single crystal substrate 10. Thereby, the thermal decomposition of the ammonia gas can be promoted on the upstream side of single crystal substrate 10. This results in less variation in the amount of N on single crystal substrate 10, and can improve the in-plane uniformity of the carrier concentration.

(Induction Heating Coil)

Generally, in film forming device 200 as shown in FIG. 10, induction heating coil 206 is wound in the axial direction of the device with a constant density of windings. The density of windings [the number of windings/m] is the number of windings of the coil per length in the axial direction of the device. In the present disclosure, the density of windings of the induction heating coil may be changed in the axial direction of the device. For example, a first region 221 adjacent to gas inlet 207, a third region 223 where single crystal substrate 10 is arranged, and a second region 222 located between first region 221 and third region 223 may have respectively different densities of windings. For example, in order to bring decomposition point 213 closer to gas inlet 207, the density of windings in first region 221 may be set higher than the density of windings in second region 222. Alternatively, in order to uniformize temperature distribution in the plane of single crystal substrate 10, the density of windings in third region 223 may be set higher than the density of windings in second region 222.

(Method for Manufacturing Silicon Carbide Epitaxial Substrate)

Next, a method for manufacturing the silicon carbide epitaxial substrate in accordance with the present embodiment will be described.

First, a silicon carbide single crystal having a polytype of 6H is manufactured by a sublimation method, for example. Silicon carbide single crystal substrate 10 is prepared by slicing the silicon carbide single crystal using a wire saw, for example. Silicon carbide single crystal substrate 10 has first main surface 11, and third main surface 13 opposite to first main surface 11. First main surface 11 is a plane inclined from the (0001) plane by less than or equal to 8°, for example. As shown in FIG. 11, silicon carbide single crystal substrate 10 is arranged in a recess of susceptor plate 210 such that first main surface 11 is exposed from susceptor plate 210. Next, silicon carbide layer 20 is formed on silicon carbide single crystal substrate 10 by the epitaxial growth, using film forming device 200.

Figure 12:
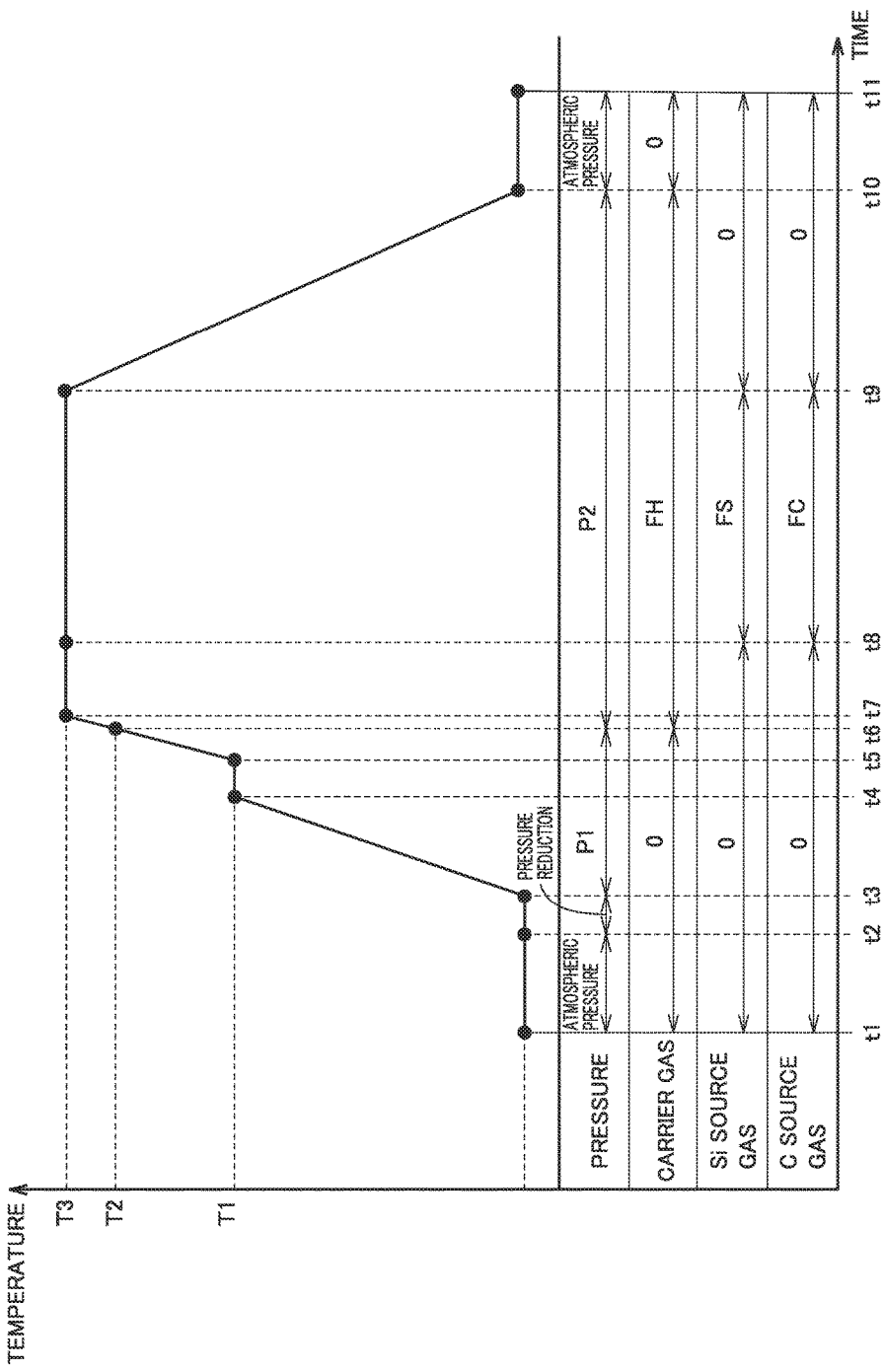
FIG. 12 is a timing chart showing an example of condition control during epitaxial growth.

FIG. 12 is a timing chart showing an example of condition control in the epitaxial growth of the present disclosure. A first time point (t1) indicates a time point at which single crystal substrate 10 is arranged on susceptor plate 210. At the first time point (t1), the temperature within reaction chamber 201 is close to room temperature, and the pressure within reaction chamber 201 is equal to the atmospheric pressure. From a second time point (t2), reduction of the pressure within reaction chamber 201 is started. At a third time point (t3), the pressure within reaction chamber 201 reaches a first pressure (P1). The first pressure (P1) is about $1 \times 10^{-6}$ Pa, for example.

From the third time point (t3), temperature rising is started. In the present disclosure, the temperature within reaction chamber 201 may be held at a first temperature (T1) from a fourth time point (t4) to a fifth time point (t5) during the temperature rising. The first temperature (T1) may be about 900 to 1300° C., for example. The holding time may be about 5 to 20 minutes, for example. Through this operation, reduction of deviation between the temperature of susceptor plate 210 and the temperature of single crystal substrate 10, and uniform temperature distribution in the plane of single crystal substrate 10 are expected.

From the fifth time point (t5), the temperature rising is resumed. In the present disclosure, hydrogen ($H_2$) gas serving as the carrier gas may be introduced from a sixth time point (t6) during the temperature rising. A second temperature (T2) at the sixth time point (t6) may be about 1300 to 1500° C., for example. The flow rate of the hydrogen gas (FH) may be about 50 to 200 slm, or about 100 to 150 slm, for example. The unit "slm" of the flow rate represents "L/min" under standard conditions (0° C., 101.3 kPa). Through this operation, for example, reduction of residual nitrogen within reaction chamber 201 is expected.

By the introduction of the hydrogen gas, the pressure within reaction chamber 201 changes from the first pressure (P1) to a second pressure (P2). The second pressure (P2) may be more than or equal to about 5 kPa and less than or equal to about 40 Pa, or more than or equal to about 5 kPa and less than or equal to about 15 kPa, for example.

At a seventh time point (t7), the temperature within reaction chamber 201 reaches a third temperature (T3). The third temperature (T3) is a growth temperature at which the epitaxial growth proceeds. The third temperature (T3) may be about 1500 to 1700° C., or about 1550 to 1650° C., for example.

From an eighth time point (t8), the source material gas and the doping gas are introduced. In the present disclosure, ammonia ($NH_3$) gas is used as the doping gas. By using the ammonia gas, improvement in in-plane uniformity can be expected. The ammonia gas may be thermally decomposed beforehand at a stage before being introduced into reaction chamber 201. The doping gas may contain nitrogen ($N_2$) gas and the like, for example, in addition to the ammonia gas.

The source material gas includes the Si source gas and the C source gas. As the Si source gas, for example, silane ($SiH_4$) gas, disilane ($Si_2H_6$) gas, dichlorosilane ($SiH_2Cl_2$) gas, trichlorosilane ($SiHCl_3$) gas, silicon tetrachloride ($SiCl_4$) gas, or the like can be used. As the C source gas, for example, methane ($CH_4$) gas, ethane ($C_2H_6$) gas, propane ($C_3H_8$) gas, acetylene ($C_2H_2$) gas, or the like can be used.

From the eighth time point (t8) to a ninth time point (t9), silicon carbide layer 20 is formed on silicon carbide single crystal substrate 10 by the epitaxial growth. Susceptor plate 210 is rotating while silicon carbide layer 20 is being formed by the epitaxial growth. Silicon carbide layer 20 includes buffer layer 27, and a drift layer 28 formed on buffer layer 27 (see FIG. 2).

Figure 13:
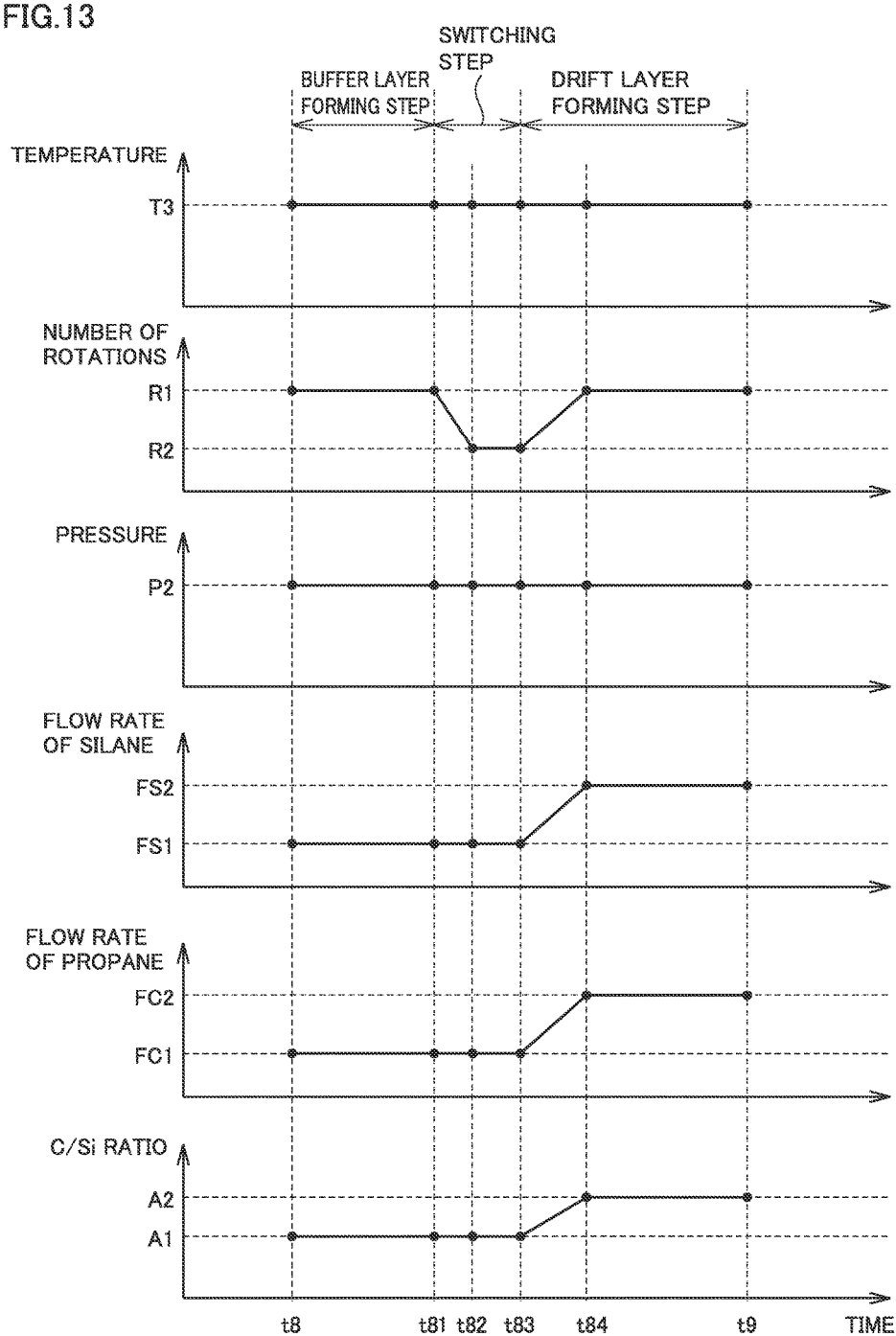
FIG. 13 is a timing chart showing details of the condition control during the epitaxial growth.

As shown in FIG. 13, from the eighth time point (t8) to a time point (t81), buffer layer 27 is formed. In the step of forming buffer layer 27, the temperature (T3) within reaction chamber 201 is 1630° C., for example. The number of rotations (R1) of susceptor plate 210 is 60 rpm, for example. The pressure (P2) within reaction chamber 201 is 8 kPa. The flow rate of the silane gas (FS1) is 46 sccm, and the flow rate of the propane gas (FC1) is 14 sccm. The volume ratio of silane to hydrogen is 0.04%, for example. The C/Si ratio (A1) of the source material gas is 0.9, for example. From the eighth time point (t8) to the time point (t81), it takes more than or equal to about 5 minutes and less than or equal to about 10 minutes, for example.

Next, from the time point (t81) to a time point (t83), a switching step is performed. Specifically, from the time point (t81) to a time point (t82), the number of rotations of susceptor plate 210 decreases from the first number of rotations (R1) to a second number of rotations (R2). The first number of rotations (R1) is 60 rpm, for example. The second number of rotations (R2) is less than 10 rpm, for example. From the time point (t81) to the time point (t83), the temperature (T3) within reaction chamber 201 is 1630° C., for example, the pressure (P2) within reaction chamber 201 is 8 kPa, the flow rate of the silane gas (FS1) is 46 sccm and the flow rate of the propane gas (FC1) is 14 sccm, the volume ratio of silane to hydrogen is 0.04%, for example, and the C/Si ratio (A1) of the source material gas is 0.9, for example. From the time point (t82) to the time point (t83), the number of rotations of susceptor plate 210 may be maintained at the second number of rotations (R2).

Next, from the time point (t83) to the ninth time point (t9), drift layer 28 is formed on buffer layer 27. Specifically, from the time point (t83) to a time point (t84), the number of rotations of susceptor plate 210 increases from the second number of rotations (R2) to the first number of rotations (R1). While the number of rotations of susceptor plate 210 is increasing, the temperature (T3) within reaction chamber 201 is 1630° C., for example, and the pressure (P2) within reaction chamber 201 is 8 kPa. From the time point (t83) to the time point (t84), the flow rate of the silane gas increases from the first flow rate (FS1) to a second flow rate (FS2). The first flow rate (FS1) is 46 sccm, for example. The second flow rate (FS2) is 92 sccm, for example. From the time point (t83) to the time point (t84), the flow rate of the propane gas increases from the first flow rate (FC1) to a second flow rate (FC2). The first flow rate (FC1) is 14 sccm, for example. The second flow rate (FC2) is 30 sccm, for example. The C/Si ratio of the source material gas increases from the first ratio (A1) to a second ratio (A2). The first ratio (A1) is 0.9, for example. The second ratio (A2) is 1.0, for example. From the time point (t83) to the time point (t84), it takes about 3 minutes to 30 minutes, for example.

From the time point (t83) to the time point (t84), the flow rate of the silane gas may once decrease from the first flow rate (FS1) to a flow rate lower than the first flow rate (FS1), and then increase to the second flow rate (FS2). Similarly, from the time point (t83) to the time point (t84), the flow rate of the propane gas may once decrease from the first flow rate (FC1) to a flow rate lower than the first flow rate (FC1), and then increase to the second flow rate (FC2).

From the time point (t84) to the ninth time point (t9), the temperature (T3) within reaction chamber 201 is 1630° C., for example. The number of rotations (R1) of susceptor plate 210 is 60 rpm, for example. The pressure (P2) within reaction chamber 201 is 8 kPa. The flow rate of the silane gas (FS2) is 92 sccm, and the flow rate of the propane gas (FC2) is 30 sccm. The volume ratio of silane to hydrogen is 0.08%, for example. The C/Si ratio (A2) of the source material gas is 1.0, for example. From the time point (t84) to the ninth time point (t9), it takes about one hour, for example.

As shown in FIG. 12, at the ninth time point (t9), supply of the source material gas is stopped, and reduction of temperature within reaction chamber 201 is started. After the temperature of reaction chamber 201 is reduced to be close to the room temperature, at a tenth time point (t10), reaction chamber 201 is opened to the atmosphere. At an eleventh time point (t11), silicon carbide epitaxial substrate 100 is removed from film forming device 200.

It should be noted that the following steps may be performed in the step of forming the drift layer. Thereby, the effect of suppressing formation of a pit is expected.

As shown in FIGS. 4 and 7, drift layer 28 may include a first layer 23 and a second layer 24. The step of forming drift layer 28 may include the step of forming first layer 23, the step of reconstructing a surface of first layer 23, and the step of forming second layer 24.

The source material gas in the step of forming the first layer may be a mixed gas of silane gas and propane gas, for example. In the step of forming the first layer, the C/Si ratio of the source material gas is adjusted to less than 1. The C/Si ratio may be more than or equal to 0.5, more than or equal to 0.6, or more than or equal to 0.7, for example, as long as the C/Si ratio is less than 1. Further, the C/Si ratio may be less than or equal to 0.95, less than or equal to 0.9, or less than or equal to 0.8, for example. The flow rate of the silane gas and the flow rate of the propane gas may be adjusted as appropriate in a range of about 10 to 100 sccm, for example, to achieve a desired C/Si ratio.

The film formation rate in the step of forming the first layer may be more than or equal to about 3 µm/h and less than or equal to about 30 µm/h, for example. The first layer has a thickness of more than or equal to 0.1 µm and less than or equal to 150 for example. The thickness of the first layer may be more than or equal to 0.2 more than or equal to 1 µm, more than or equal to 10 µm, or more than or equal to 15 µm. Further, the thickness of the first layer may be less than or equal to 100 µm, less than or equal to 75 µm, or less than or equal to 50 µm.

Next, the step of reconstructing the surface of the first layer is performed. The step of reconstructing the surface may be performed continuously after the step of forming the first layer. Alternatively, a predetermined halt time may be provided between the step of forming the first layer and the step of reconstructing the surface. In the step of reconstructing the surface, the temperature of the susceptor may be increased by about 10 to 30° C.

In the step of reconstructing the surface, a mixed gas including a source material gas having a C/Si ratio of less than 1 and hydrogen gas is used. The C/Si ratio of the source material gas may be lower than the C/Si ratio in the step of forming the first layer. The C/Si ratio may be more than or equal to 0.5, more than or equal to 0.6, or more than or equal to 0.7, as long as the C/Si ratio is less than 1. Further, the C/Si ratio may be less than or equal to 0.95, less than or equal to 0.9, or less than or equal to 0.8, for example.

In the step of reconstructing the surface, there may be used a source material gas different from the source material gas used in the step of forming the first layer and the step of forming the second layer described later. In this way, the effect of suppressing formation of a pit is expected to be enhanced. For example, there is conceivable a configuration such that, in the step of forming the first layer and the step of forming the second layer described later, silane gas and propane gas are used, whereas in the step of reconstructing the surface, dichlorosilane and acetylene are used.

In the step of reconstructing the surface, the ratio of the flow rate of the source material gas to the flow rate of the hydrogen gas may be decreased, when compared with the step of forming the first layer and the step of forming the second layer described later. Thereby, the effect of suppressing formation of a deep pit is expected to be enhanced.

The flow rate of the hydrogen gas in the mixed gas may be more than or equal to about 100 slm and less than or equal to about 150 slm, for example. The flow rate of the hydrogen gas may be about 120 slm, for example. The flow rate of the Si source gas in the mixed gas may be more than or equal to 1 sccm and less than or equal to 5 sccm, for example. The lower limit of the flow rate of the Si source gas may be 2 sccm. The upper limit of the flow rate of the Si source gas may be 4 sccm. The flow rate of the C source gas in the mixed gas may be more than or equal to 0.3 sccm and less than or equal to 1.6 sccm, for example. The lower limit of the flow rate of the C source gas may be 0.5 sccm or 0.7 sccm. The upper limit of the flow rate of the C source gas may be 1.4 sccm or 1.2 sccm.

In the step of reconstructing the surface, it is desirable to adjust various conditions such that etching by the hydrogen gas is comparable to epitaxial growth by the source material gas. For example, it is conceivable to adjust the flow rate of the hydrogen gas and the flow rate of the source material gas to attain a film formation rate of about 0±0.5 µm/h. The film formation rate may be adjusted to about 0±0.4 µm/h, may be adjusted to about 0±0.3 µm/h, may be adjusted to about 0±0.2 µm/h, or may be adjusted to about 0±0.1 µm/h. Thereby, the effect of suppressing formation of a pit is expected to be enhanced.

The treatment time in the step of reconstructing the surface is more than or equal to about 30 minutes and less than or equal to about 10 hours, for example. The treatment time may be less than or equal to 8 hours, less than or equal to 6 hours, less than or equal to 4 hours, or less than or equal to 2 hours.

After the surface of the first layer is reconstructed, the step of forming the second layer on this surface is performed. Second layer 24 (see FIGS. 4 and 7) is formed using a source material gas having a C/Si ratio of more than or equal to 1. The C/Si ratio may be more than or equal to 1.05, more than or equal to 1.1, more than or equal to 1.2, more than or equal to 1.3, or more than or equal to 1.4, for example, as long as the C/Si ratio is more than or equal to than 1. Further, the C/Si ratio may be less than or equal to 2.0, less than or equal to 1.8, or less than or equal to 1.6.

The source material gas in the step of forming the second layer may be the same as or different from the source material gas used in the step of forming the first layer. The source material gas may be silane gas and propane gas, for example. The flow rate of the silane gas and the flow rate of the propane gas may be adjusted as appropriate in a range of about 10 to 100 sccm, for example, to achieve a desired C/Si ratio. The flow rate of the carrier gas may be about 50 slm to 200 slm, for example.

The film formation rate in the step of forming the second layer may be more than or equal to about 5 µm/h and less than or equal to about 100 µm/h, for example. The second layer has a thickness of more than or equal to 1 µm and less than or equal to 150 µm, for example. The thickness of the second layer may be more than or equal to 5 µm, more than or equal to 10 µm, or more than or equal to 15 µm. Further, the thickness of the second layer may be less than or equal to 100 µm, less than or equal to 75 µm, or less than or equal to 50 µm.

The thickness of the second layer may be the same as or different from the thickness of the first layer. The second layer may be thinner than the first layer. For example, the ratio of the thickness of the second layer to the thickness of the first layer may be more than or equal to about 0.01 and less than or equal to about 0.9. Here, the ratio of the thicknesses represents a value obtained by dividing the thickness of the second layer by the thickness of the first layer having been through the step of reconstructing the surface. The ratio of the thicknesses may be less than or equal to 0.8, less than or equal to 0.7, less than or equal to 0.6, less than or equal to 0.5, less than or equal to 0.4, less than or equal to 0.3, less than or equal to 0.2, or less than or equal to 0.1. Thereby, the effect of suppressing formation of a pit is expected to be enhanced.

Next, a method for further improving the in-plane uniformity of the carrier concentration will be described.

Figure 14:
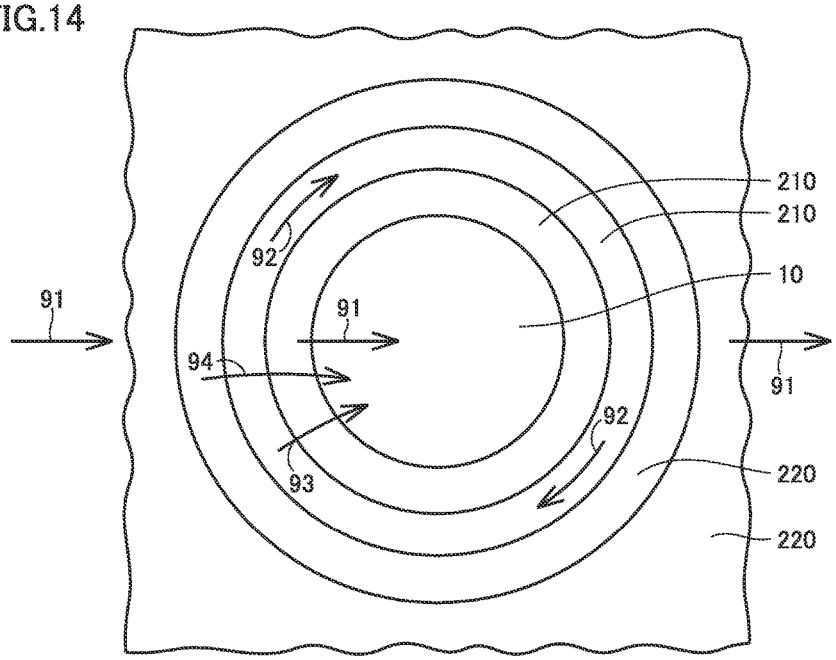
FIG. 14 is a schematic plan view showing a first example of a configuration in the vicinity of a susceptor plate.

As shown in FIG. 14, second arrows 92 indicate a direction in which susceptor plate 210 rotates. Further, first arrows 91 indicate a direction in which the source material gas flows. The source material gas includes a dopant gas. As indicated by first arrows 91, the source material gas flows along one direction. However, since susceptor plate 210 rotates, supply of the source material gas to silicon carbide single crystal substrate 10 becomes substantially uniform in the direction in which susceptor plate 210 rotates.

Desirably, susceptor plate 210 and heating element 220 are composed of a material having a low nitrogen concentration, in order to reduce the background concentration of nitrogen in silicon carbide layer 20. In FIG. 14, a third arrow 93 indicates nitrogen emitted from susceptor plate 210, and a fourth arrow 94 indicates nitrogen emitted from heating element 220. When susceptor plate 210 and heating element 220 contain nitrogen, the nitrogen is supplied to silicon carbide single crystal substrate 10 and silicon carbide layer 20 together with the source material gas as indicated by third arrow 93 and fourth arrow 94, and serves as the background of nitrogen.

Due to the influence of the background, the in-plane uniformity of the carrier concentration (nitrogen concentration) is reduced. Such a tendency is significant in a case where the nitrogen concentration in silicon carbide layer 20 is set to a low concentration. The case where the nitrogen concentration is set to a low concentration is a case where the nitrogen concentration is set to less than or equal to $2 \times 10^{16}$ cm$^{-3}$, for example.

Figure 15:
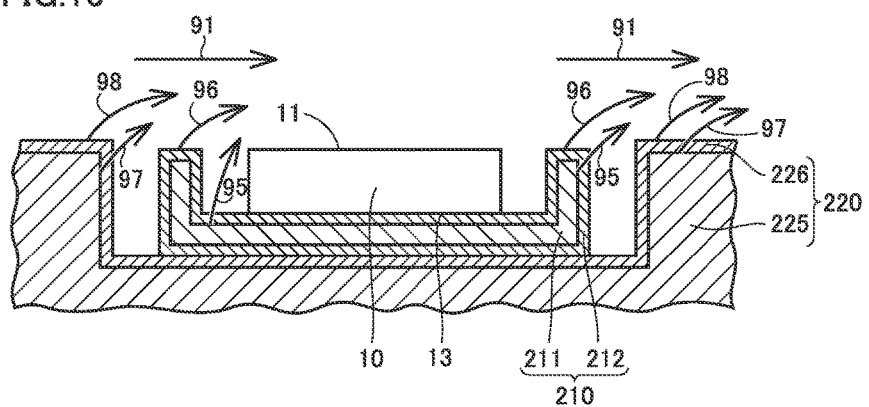
FIG. 15 is a schematic cross sectional view showing a second example of the configuration in the vicinity of the susceptor plate.

Accordingly, the present embodiment adopts a configuration in which nitrogen contained in susceptor plate 210 and heating element 220 has a low concentration. FIG. 15 is a schematic cross sectional view showing a configuration in the vicinity of susceptor plate 210. As shown in FIG. 15, susceptor plate 210 includes a first base member 211, and a first coat portion 212 covering first base member 211. In addition, heating element 220 includes a second base member 225, and a second coat portion 226 covering second base member 225.

First base member 211 and second base member 225 are composed of a carbon material, for example. The nitrogen concentration in first base member 211 and second base member 225 is preferably less than or equal to 10 ppm, and more preferably less than or equal to 5 ppm. First coat portion 212 and second coat portion 226 are composed of silicon carbide (SiC), tantalum carbide (TaC), or the like, for example. The nitrogen concentration in first coat portion 212 and second coat portion 226 is preferably less than or equal to 10 ppm, and more preferably less than or equal to 5 ppm. The arithmetic average roughness (Ra) of a surface of first coat portion 212 may be less than or equal to the arithmetic average roughness (Ra) of third main surface 13 of single crystal substrate 10 which is to come into contact with first coat portion 212. Thereby, uniform temperature distribution in the plane of the single crystal substrate is expected.

In FIG. 15, fifth arrows 95 indicate nitrogen emitted from first base member 211, and sixth arrows 96 indicate nitrogen emitted from first coat portion 212. In addition, seventh arrows 97 indicate nitrogen emitted from second base member 225, and eighth arrows 98 indicate nitrogen emitted from second coat portion 226. These nitrogens can be sufficiently reduced by setting the nitrogen concentration in each member to a low concentration as described above. Thereby, the background concentration of nitrogen in silicon carbide layer 20 can be set to less than or equal to $1 \times 10^{15}$ cm$^{-3}$.

(Variation of Silicon Carbide Epitaxial Substrate)

Next, a configuration of a silicon carbide epitaxial substrate in accordance with a variation of the present embodiment will be described. As shown in FIG. 1, second main surface 12 of silicon carbide epitaxial substrate 100 in accordance with the variation may be a (000-1) plane, or a plane inclined from the (000-1) plane by less than or equal to 8°. The inclination direction (off direction) of a normal to second main surface 12 may be the <11-20> direction, for example. The inclination angle (off angle) from the (000-1) plane may be more than or equal to 1°, more than or equal to 2°, or more than or equal to 3°. The off angle may be less than or equal to 7°, or less than or equal to 6°.

In silicon carbide layer 20, the average value of the carrier concentration is less than or equal to $2 \times 10^{16}$ cm$^{-3}$. The average value of the carrier concentration may be less than or equal to $1 \times 10^{16}$ cm$^{-3}$, less than or equal to $9 \times 10^{15}$ cm$^{-3}$, or less than or equal to $8 \times 10^{15}$ cm$^{-3}$. Further, the average value of the carrier concentration may be more than or equal to $1 \times 10^{15}$ cm$^{-3}$, more than or equal to $5 \times 10^{15}$ cm$^{-3}$, or more than or equal to $6 \times 10^{15}$ cm$^{-3}$, for example.

In the direction parallel to second main surface 12, the ratio (σ/ave) of the standard deviation of the carrier concentration to the average value of the carrier concentration in silicon carbide layer 20 may be less than or equal to 5%. The ratio having a smaller value is more preferable, and the ratio is ideally zero. The ratio may be less than or equal to 4%, less than or equal to 3%, less than or equal to 2%, or less than or equal to 1%.

As shown in FIG. 3, second main surface 12 includes outer peripheral region 123, an intermediate region 127, and a central portion 121. A region composed of outer peripheral region 123 and intermediate region 127 is a region which is within 30 mm from outer edge 124 of second main surface 12 toward the center of second main surface 12.

(Trapezoidal Defects)

According to the present disclosure, the defect density of trapezoidal defects in second main surface 12 may be able to be reduced. That is, in the present disclosure, trapezoidal defects in second main surface 12 may have a defect density of less than or equal to 0.5 cm$^{-2}$. The lower the defect density of trapezoidal defects is, the more it is preferable, and the defect density of trapezoidal defects is ideally zero. The defect density of trapezoidal defects may be less than or equal to 0.3 cm$^{-2}$, less than or equal to 0.1 cm$^{-2}$, or less than or equal to 0.01 cm$^{-2}$.

Figure 16:
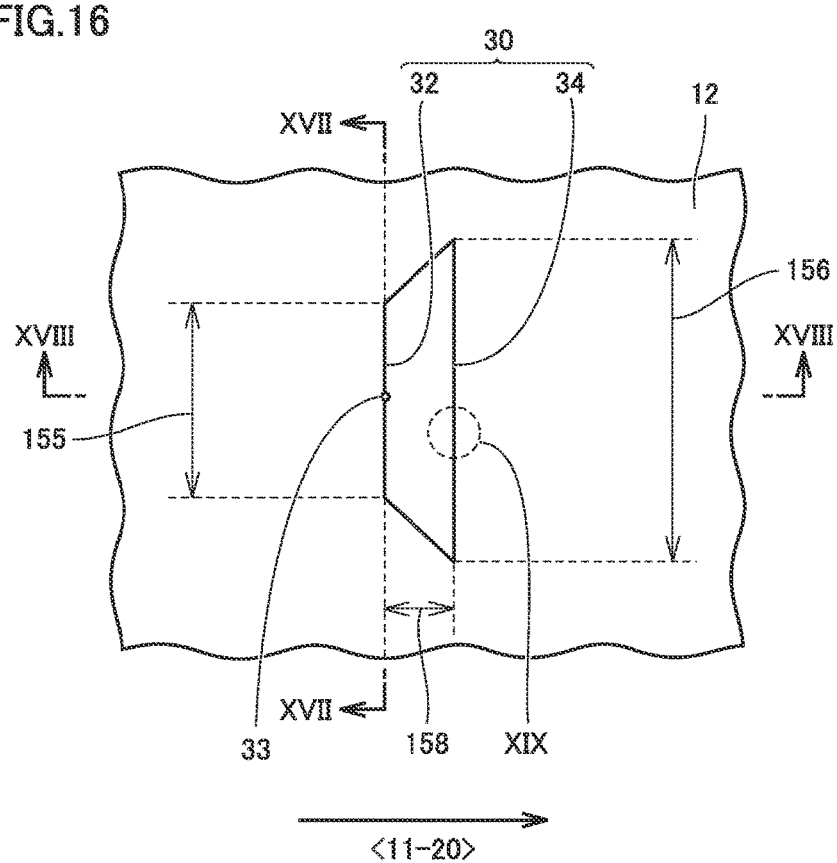
FIG. 16 is a schematic plan view showing a configuration of a trapezoidal defect.

A trapezoidal defect is a trapezoidal depression in second main surface 12. As shown in FIG. 16, trapezoidal defect 30 includes upper base portion 32 and lower base portion 34 intersecting with the <11-20> direction. Upper base portion 32 has a width 155 of more than or equal to 0.1 μm and less than or equal to 100 μm. Lower base portion 34 has a width 156 of more than or equal to 50 μm and less than or equal to 5000 μm.

FIG. 17 is a schematic cross sectional view taken along a line XVII-XVII in FIG. 16. As shown in FIG. 17, upper base portion 32 may include protruding portion 33. Protruding portion 33 may be located substantially at the center of upper base portion 32. In upper base portion 32, protruding portion 33 protrudes relative to a portion other than protruding portion 33. Protruding portion 33 has a height 157 of more than or equal to about 5 nm and less than or equal to about 20 nm. Height 157 of protruding portion 33 can be measured with a white light interferometric microscope (such as "BW-D507" manufactured by Nikon Corporation), for example. A mercury lamp can be adopted as a light source for the white light interferometric microscope. The field of view for observation can be set to 250 μm×250 μm.

FIG. 18 is a schematic cross sectional view taken along a line XVIII-XVIII in FIG. 16. An angle θ in FIG. 18 corresponds to an off angle. Inside trapezoidal defect 30, that is, in a region between upper base portion 32 and lower base portion 34, the surface of silicon carbide layer 20 slightly recedes toward single crystal substrate 10. In other words, trapezoidal defect 30 includes a recess formed in second main surface 12. Trapezoidal defect 30 may have an origin 31 at an interface between single crystal substrate 10 and silicon carbide layer 20. As shown in FIG. 17, a dislocation extending from origin 31 may be connected with protruding portion 33 described above.

Figure 19:
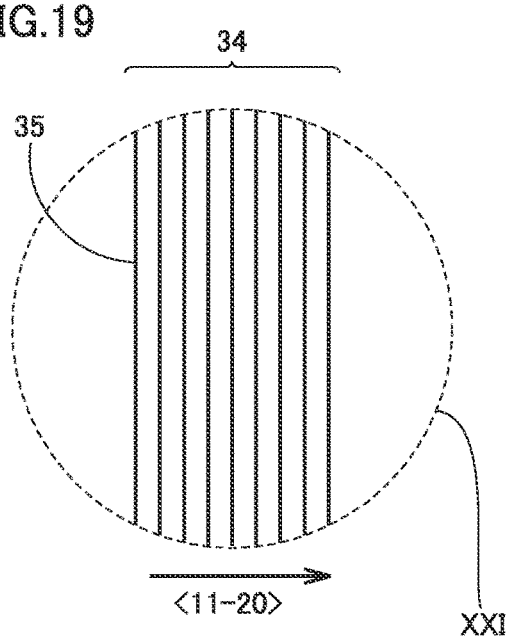
FIG. 19 is an enlarged view of a region XIX in FIG. 16.

FIG. 19 is an enlarged view of a region XIX in FIG. 16. As shown in FIG. 19, lower base portion 34 may include the plurality of step bunchings 35. The "step bunching" refers to a linear defect in which a plurality of atomic steps form a bunch and produce a level difference of more than or equal to 1 nm. The size of the level difference in the step bunching may be about 1 to 5 nm, for example. The size of the level difference in the step bunching can be measured with an AFM, for example. The number of the step bunchings included in lower base portion 34 may be about 2 to 100, or about 2 to 50, for example. The number of the step bunchings included in lower base portion 34 can also be counted by observing lower base portion 34 with the AFM.

As the AFM, for example, "Dimension 300" manufactured by Veeco or the like can be adopted. As a cantilever for the AFM, "NCHV-10V" manufactured by Bruker or the like is suitable. Conditions for the AFM are set as follows. The measurement mode is set to a tapping mode. The measurement region in the tapping mode is set to a square measuring 20 μm per side. The measurement depth is set to 1.0 μm. For sampling in the tapping mode, the scanning speed within the measurement region is set to 5 seconds for one cycle, the number of scan lines is set to 512, and the number of measurement points for each scan line is set to 512 points. Controlled displacement of the cantilever is set to 15.50 nm.

(Triangular Defects)

Figure 20:
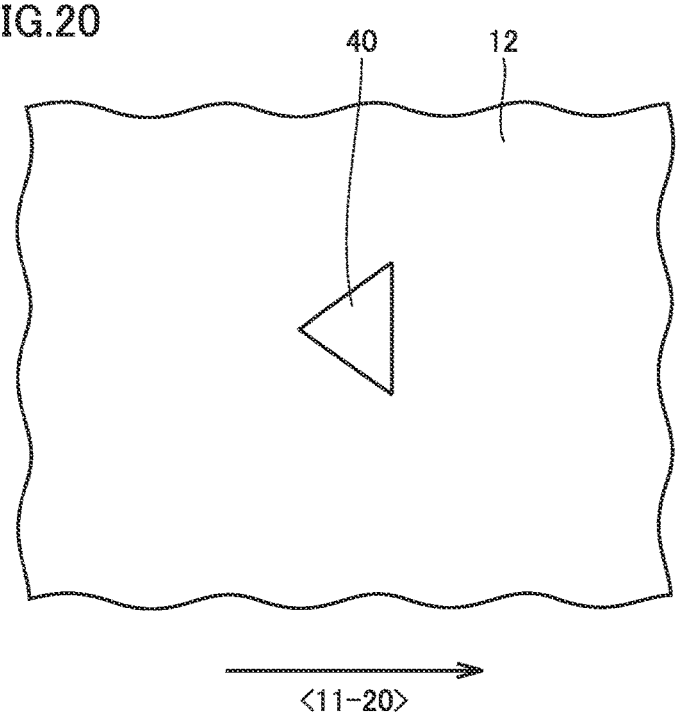
FIG. 20 is a schematic plan view showing a configuration of a triangular defect.

According to the present disclosure, the defect density of triangular defects in second main surface 12 may be able to be reduced. That is, in the present disclosure, triangular defects in second main surface 12 may have a density of less than or equal to 0.5 $cm^{-2}$. As shown in FIG. 20, triangular defect 40 is a triangular depression in second main surface 12. Triangular defect 40 includes a side intersecting with the <11-20> direction. Each side has a length of about 1 to 1000 μm. The lower the defect density of triangular defects is, the more it is preferable, and the defect density of triangular defects is ideally zero. The defect density of triangular defects may be less than or equal to 0.3 $cm^{-2}$, less than or equal to 0.1 $cm^{-2}$, or less than or equal to 0.01 $cm^{-2}$.

(Method for Measuring Defect Density)

The trapezoidal defects and the triangular defects in second main surface 12 can be observed using a Nomarski-type optical microscope (for example, "MX-51" manufactured by Olympus Corporation), for example. The defect densities of the trapezoidal defects and the triangular defects can be calculated, for example, by analyzing the entire surface of second main surface 12 at a magnification of 50 times to 400 times, and dividing the number of each type of the detected defects by the area of second main surface 12. It should be noted that, generally, the entire surface described above does not include a region which is not utilized for a semiconductor device. The region which is not utilized for a semiconductor device is, for example, a region which is 3 mm from an edge of a substrate.

Next, a method for manufacturing the silicon carbide epitaxial substrate in accordance with the variation will be described. In the method for manufacturing the silicon carbide epitaxial substrate in accordance with the variation, silicon carbide single crystal substrate 10 is arranged on susceptor plate 210 such that second main surface 12 of silicon carbide single crystal substrate 10 faces upward (see FIG. 11). Second main surface 12 is a (000-1) plane, or a plane inclined from the (000-1) plane by less than or equal to 8°. Other steps are the same as those in the manufacturing method in accordance with the embodiment, and thus they are not repeated.

(Method for Manufacturing Silicon Carbide Semiconductor Device)

Next, a method for manufacturing silicon carbide semiconductor device 300 in accordance with the present embodiment will be described.

Figure 21:
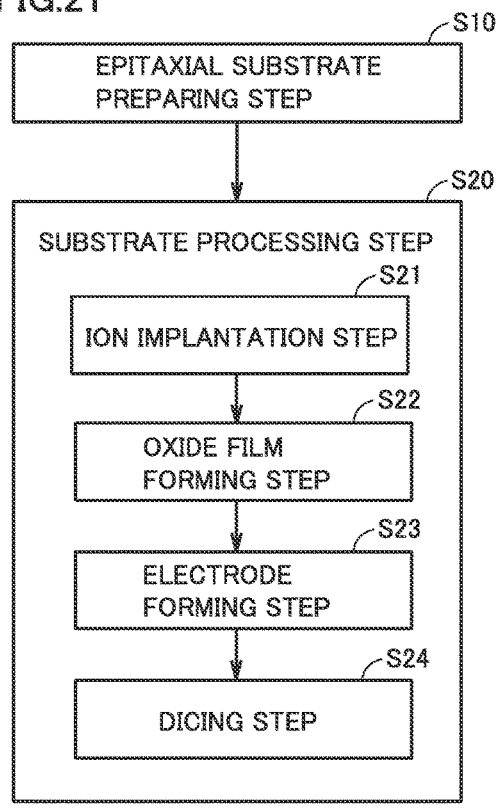
FIG. 21 is a flowchart schematically showing a method for manufacturing a silicon carbide semiconductor device in accordance with the present embodiment.

The method for manufacturing the silicon carbide semiconductor device in accordance with the present embodiment mainly has an epitaxial substrate preparing step (S10: FIG. 21) and a substrate processing step (S20: FIG. 21).

First, the silicon carbide epitaxial substrate preparing step (S10: FIG. 21) is performed. Specifically, a silicon carbide epitaxial substrate is prepared by the method for manufacturing the silicon carbide epitaxial substrate described above.

Next, the substrate processing step (S20: FIG. 21) is performed. Specifically, a silicon carbide semiconductor device is manufactured by processing the silicon carbide epitaxial substrate. The "processing" includes various types of processing such as ion implantation, heat treatment, etching, oxide film formation, electrode formation, dicing, and the like, for example. That is, the substrate processing step may include at least any one of ion implantation, heat treatment, etching, oxide film formation, electrode formation, and dicing.

Hereinafter, a method for manufacturing a MOSFET (Metal Oxide Semiconductor Field Effect Transistor) as an exemplary silicon carbide semiconductor device will be described. The substrate processing step (S20: FIG. 21) includes an ion implantation step (S21: FIG. 21), an oxide film forming step (S22: FIG. 21), an electrode forming step (S23: FIG. 21), and a dicing step (S24: FIG. 21).

Figure 22:
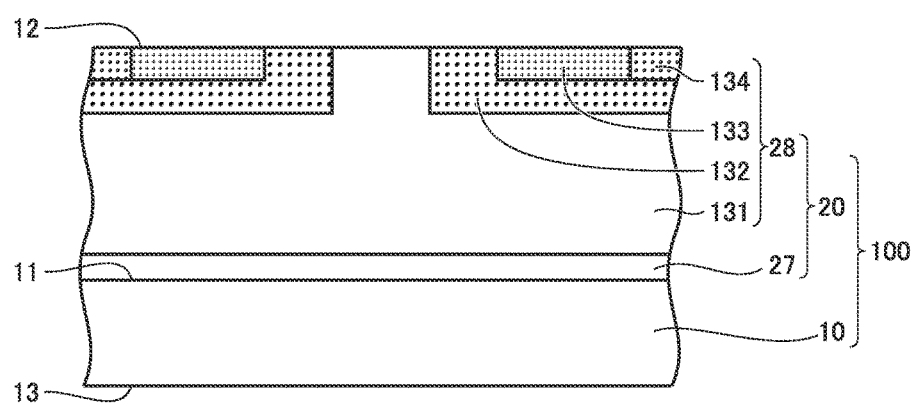
FIG. 22 is a schematic cross sectional view showing a first step of the method for manufacturing the silicon carbide semiconductor device in accordance with the present embodiment.

First, the ion implantation step (S21: FIG. 21) is performed. A p type impurity such as aluminum (Al), for example, is implanted into second main surface 12 on which a mask (not shown) having an opening is formed. Thereby, a body region 132 having a p type conductivity type is formed. Next, an n type impurity such as phosphorus (P), for example, is implanted into a predetermined position within body region 132. Thereby, a source region 133 having an n type conductivity type is formed. Next, a p type impurity such as aluminum is implanted into a predetermined position within source region 133. Thereby, a contact region 134 having the p type conductivity type is formed (see FIG. 22).

In silicon carbide layer 20, a portion other than body region 132, source region 133, and contact region 134 serves as a drift region 131. Source region 133 is separated from drift region 131 by body region 132. Ion implantation may be performed with silicon carbide epitaxial substrate 100 being heated to more than or equal to about 300° C. and less than or equal to about 600° C. After the ion implantation, activation annealing is performed on silicon carbide epitaxial substrate 100. By the activation annealing, the impurities implanted into silicon carbide layer 20 are activated, and carriers are generated in each region. The atmosphere for the activation annealing may be an argon (Ar) atmosphere, for example. The temperature for the activation annealing may be about 1800° C., for example. The time for the activation annealing may be about 30 minutes, for example.

Figure 23:
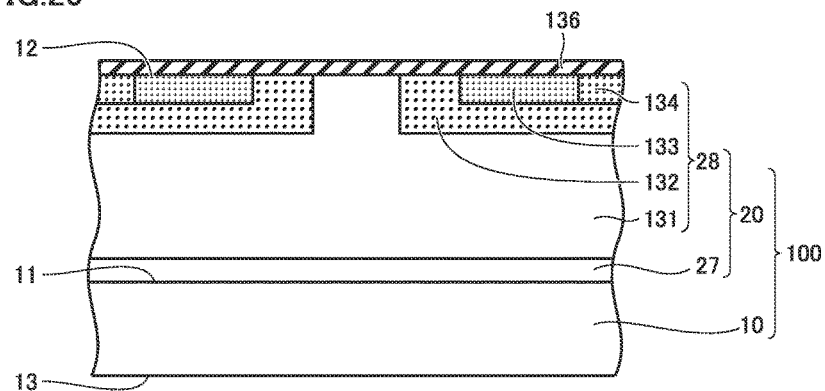
FIG. 23 is a schematic cross sectional view showing a second step of the method for manufacturing the silicon carbide semiconductor device in accordance with the present embodiment.

Next, the oxide film forming step (S22: FIG. 21) is performed. An oxide film 136 is formed on second main surface 12 (see FIG. 23) by heating silicon carbide epitaxial substrate 100 in an atmosphere containing oxygen, for example. Oxide film 136 is composed of silicon dioxide ($SiO_2$) or the like, for example. Oxide film 136 functions as a gate insulating film. The temperature for thermal oxidation treatment may be about 1300° C., for example. The time for the thermal oxidation treatment may be about 30 minutes, for example.

After oxide film 136 is formed, heat treatment may be further performed in a nitrogen atmosphere. For example, the heat treatment may be performed in an atmosphere of nitric oxide (NO), nitrous oxide ($N_2O$), or the like, at about 1100° C., for about one hour. Thereafter, heat treatment may be further performed in an argon atmosphere. For example, the heat treatment may be performed in an argon atmosphere, at about 1100 to 1500° C., for about one hour.

Next, the electrode forming step (S23: FIG. 21) is performed. A first electrode 141 is formed on oxide film 136. First electrode 141 functions as a gate electrode. First electrode 141 is formed by a CVD method, for example. First electrode 141 is composed of polysilicon or the like containing an impurity and having electrical conductivity, for example. First electrode 141 is formed at a position facing source region 133 and body region 132.

Next, an interlayer insulating film 137 covering first electrode 141 is formed. Interlayer insulating film 137 is formed by the CVD method, for example. Interlayer insulating film 137 is composed of silicon dioxide or the like, for example. Interlayer insulating film 137 is formed to come into contact with first electrode 141 and oxide film 136. Next, oxide film 136 and interlayer insulating film 137 at a predetermined position are removed by etching. Thereby, source region 133 and contact region 134 are exposed from oxide film 136.

At the exposed portion, a second electrode 142 is formed by a sputtering method, for example. Second electrode 142 functions as a source electrode. Second electrode 142 is composed of titanium, aluminum, silicon, or the like, for example. After second electrode 142 is formed, second electrode 142 and silicon carbide epitaxial substrate 100 are heated at a temperature of about 900 to 1100° C., for example. Thereby, second electrode 142 and silicon carbide epitaxial substrate 100 come into ohmic contact with each other. Next, an interconnection layer 138 is formed to come into contact with second electrode 142. Interconnection layer 138 is composed of a material containing aluminum, for example.

Next, a third electrode 143 is formed on third main surface 13. Third electrode 143 functions as a drain electrode. Third electrode 143 is composed of an alloy containing nickel and silicon (for example, NiSi or the like), for example.

Figure 24:
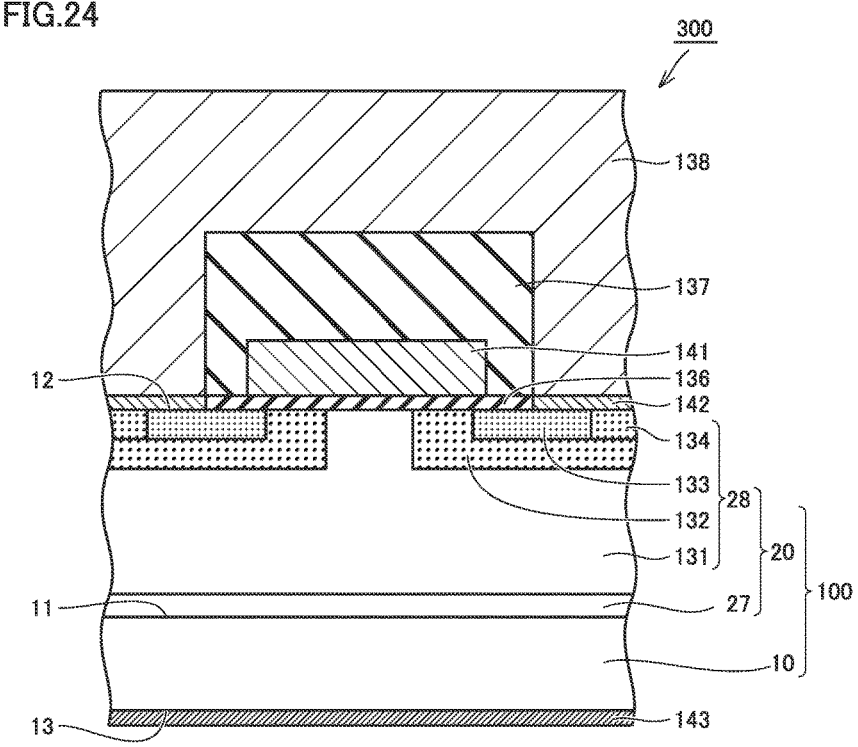
FIG. 24 is a schematic cross sectional view showing a third step of the method for manufacturing the silicon carbide semiconductor device in accordance with the present embodiment.

Next, the dicing step (S24: FIG. 21) is performed. Silicon carbide epitaxial substrate 100 is divided into a plurality of semiconductor chips by being diced along dicing lines. Thus, silicon carbide semiconductor device 300 is manufactured (see FIG. 24).

Although the method for manufacturing the silicon carbide semiconductor device in accordance with the present disclosure has been described above by taking a MOSFET as an example, the manufacturing method in accordance with the present disclosure is not limited thereto. The manufacturing method in accordance with the present disclosure is applicable to various silicon carbide semiconductor devices such as an IGBT (Insulated Gate Bipolar Transistor), an SBD (Schottky Barrier Diode), a thyristor, a GTO (Gate Turn Off thyristor), a PiN diode, and the like, for example.

(Evaluation 1)

1-1. Fabrication of Samples

First, silicon carbide epitaxial substrates 100 in accordance with samples 1 and 2 are prepared. Silicon carbide epitaxial substrate 100 in accordance with sample 2 is manufactured using the manufacturing method in accordance with the present embodiment. Specifically, silicon carbide layer 20 is formed, with the number of rotations of the susceptor plate, the flow rate of silane, the flow rate of propane, and the C/Si ratio being changed from the time point (t8) to the time point (t9) as shown in FIG. 13. Specifically, from the time point (t83) to the time point (t84), the C/Si ratio changes from 0.9 (A1) to 1.0 to 1.1 (A2) (see FIG. 13). In contrast, in the silicon carbide epitaxial substrate in accordance with sample 1, silicon carbide layer 20 is formed, with the number of rotations of the susceptor plate, the flow rate of silane, the flow rate of propane, and the C/Si ratio being maintained to be substantially constant from the time point (t8) to the time point (t9). Specifically, from the time point (t8) to the time point (t9), the C/Si ratio is maintained at more than or equal to 1.5. It should be noted that second main surfaces 12 of silicon carbide epitaxial substrates 100 in accordance with samples 1 and 2 are planes having an off angle of 4° from the (0001) plane.

Next, the substrate processing step (S20: FIG. 21) described above is performed on silicon carbide epitaxial substrates 100 in accordance with samples 1 and 2. Thereby, 18 MOSFETs in the shape of chips are manufactured from each sample.

1-2. Conditions for Experiment

Long term reliability of the silicon carbide semiconductor devices is evaluated by constant current TDDB (Time Dependent Dielectric Breakdown). The environmental temperature is 25° C. The current density is 20 mA/cm$^2$.

1-3. Result of Evaluation on Reliability of MOSFET

Figure 25:
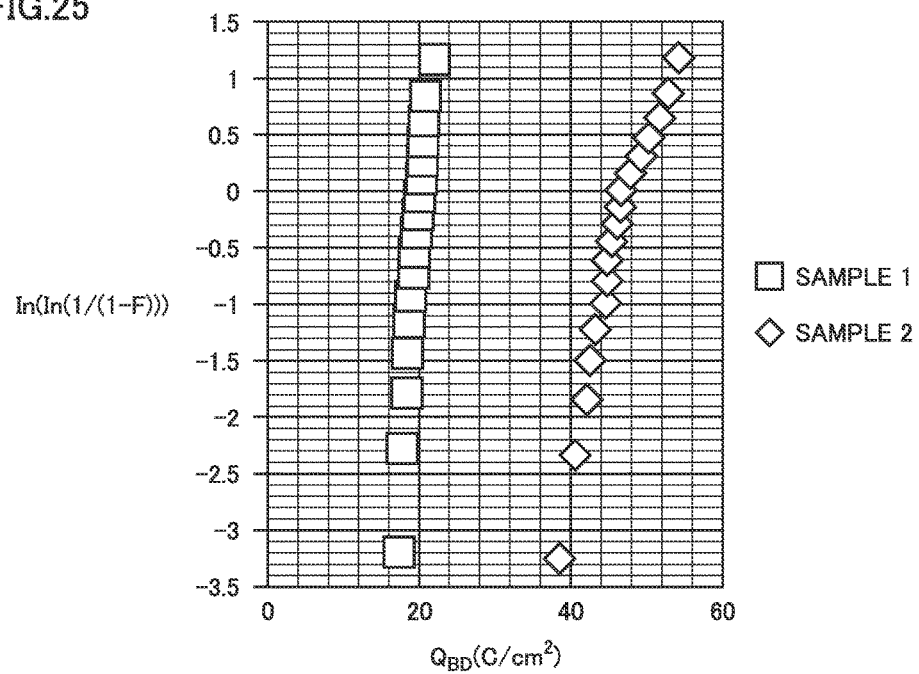
FIG. 25 is a Weibull plot showing the relation between a charge-to-breakdown ($Q_{BD}$) and a cumulative failure rate (F).

FIG. 25 is a Weibull plot showing constant current TDDB measurement results. In FIG. 25, the axis of ordinates represents a cumulative failure rate (F) plotted on Weibull probability paper, and the axis of abscissas represents a charge-to-breakdown ($Q_{BD}$) [unit: C/cm$^2$]. The charge-to-breakdown is a total amount of charge which has passed through a gate insulating film until a MOSFET breaks down. The larger the charge-to-breakdown is, the higher the long term reliability is. In FIG. 25, a plot group including square legends indicates the MOSFETs manufactured from silicon carbide epitaxial substrate 100 in accordance with sample 1. A plot group including rhombic legends indicates the MOSFETs manufactured from silicon carbide epitaxial substrate 100 in accordance with sample 2.

As shown in FIG. 25, in the MOSFETs manufactured from silicon carbide epitaxial substrate 100 in accordance with sample 1, the charge-to-breakdown at a cumulative failure rate (F) of about 63% (in other words, at a position of 0 on the axis of ordinates) is about 21 C/cm$^2$. In contrast, in the MOSFETs manufactured from silicon carbide epitaxial substrate 100 in accordance with sample 2, the charge-to-breakdown at a cumulative failure rate (F) of about 63% is about 47 C/cm$^2$. The above result indicates that the long term reliability of the MOSFETs manufactured from silicon carbide epitaxial substrate 100 in accordance with sample 2 is higher than the long term reliability of the MOSFETs manufactured from silicon carbide epitaxial substrate 100 in accordance with sample 2.

(Evaluation 2)

2-1. Fabrication of Samples

First, silicon carbide epitaxial substrates 100 in accordance with samples 3 to 6 are prepared. Silicon carbide epitaxial substrates 100 in accordance with samples 3 and 4 are manufactured using the manufacturing method in accordance with the present embodiment. Specifically, silicon carbide layer 20 is formed, with the number of rotations of the susceptor plate, the flow rate of silane, the flow rate of propane, and the C/Si ratio being changed from the time point (t8) to the time point (t9) as shown in FIG. 13. Samples 3 and 4 are manufactured under the same conditions as those for sample 2. For silicon carbide epitaxial substrate 100 in accordance with sample 3, after silicon carbide layer 20 is formed on silicon carbide single crystal substrate 10 by epitaxial growth, CMP (Chemical Mechanical Polishing) treatment is performed on second main surface 12 to planarize second main surface 12. For silicon carbide epitaxial substrate 100 in accordance with sample 4, the CMP treatment is not performed. In contrast, in the silicon carbide epitaxial substrate in accordance with sample 1, silicon carbide layer 20 is formed, with the number of rotations of the susceptor plate, the flow rate of silane, the flow rate of propane, and the C/Si ratio being maintained to be substantially constant from the time point (t8) to the time point (t9). For sample 5, from the time point (t8) to the time point (t9), the C/Si ratio is maintained at 1.3. For sample 6, from the time point (t8) to the time point (t9), the C/Si ratio is maintained at 1.9. It should be noted that second main surfaces 12 of silicon carbide epitaxial substrates 100 in accordance with samples 3 to 6 are planes having an off angle of 4° from the (0001) plane.

Next, the substrate processing step (S20: FIG. 21) described above is performed on silicon carbide epitaxial substrates 100 in accordance with samples 3 to 6. Thereby, 18 MOSFETs in the shape of chips are manufactured from each sample.

2-2. Conditions for Experiment

Hazes in central regions 126 of second main surfaces 12 of silicon carbide epitaxial substrates 100 in accordance with samples 3 to 6 are measured. The hazes are measured using SICA manufactured by Lasertec Corporation, for example. The measuring method is as described above. The value of the haze of each sample is plotted on the axis of abscissas in FIG. 26.

Then, long term reliability of the silicon carbide semiconductor devices is evaluated by constant current TDDB. The environmental temperature is 25° C. The current density is 20 mA/cm$^2$. The cumulative failure rate (F) and the charge-to-breakdown ($Q_{BD}$) are plotted on a Weibull plot, as in FIG. 25. In the MOSFETs manufactured from silicon carbide epitaxial substrate 100 in accordance with each sample, the charge-to-breakdown at a cumulative failure rate (F) of about 63% (in other words, at a position of 0 on the axis of ordinates) is determined, and the charge-to-breakdown is plotted on the axis of ordinates in FIG. 26.

2-3. Result of Evaluation on Reliability of MOSFET

Figure 26:
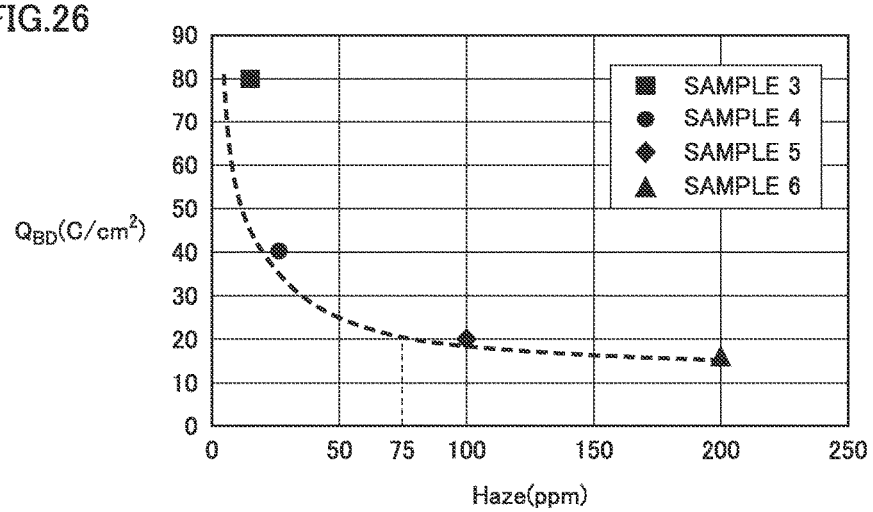
FIG. 26 is a view showing the relation between a haze and the charge-to-breakdown ($Q_{BD}$).

As can be seen in FIG. 26, the charge-to-breakdown becomes larger as the value of the haze becomes smaller. Even when the value of the haze becomes more than 75 ppm, the charge-to-breakdown does not become smaller too much. In contrast, when the value of the haze becomes less than or equal to 75 ppm, the charge-to-breakdown sharply becomes larger. That is, it is conceivable that the reliability of an insulating film of a MOSFET is significantly improved by setting the value of the haze to less than or equal to 75 ppm.

It should be understood that the embodiment disclosed herein is illustrative and non-restrictive in every respect. The scope of the present invention is defined by the scope of the claims, rather than the embodiment described above, and is intended to include any modifications within the scope and meaning equivalent to the scope of the claims.

REFERENCE SIGNS LIST 1, 2, 90: pit; 3: first straight line; 4: second straight line; 5: first flat; 6: first plot group; 7: second plot group; 8: step-flow growth direction (one direction); 10: silicon carbide single crystal substrate; 11: first main surface; 12: second main surface; 13: third main surface; 14: fourth main surface (surface); 20: silicon carbide layer; 23: first layer; 24: second layer; 25: threading dislocation; 26: bottom layer region; 27: buffer layer; 28: drift layer; 29: surface layer region; 30: trapezoidal defect; 31: origin; 32: upper base portion; 33: protruding portion; 34: base portion; 35: step bunching; 40: triangular defect; 50: bar-like pit; 51: first width; 52: second width; 60: circular pit; 70: triangular pit; 80: groove portion; 81: first groove portion; 82: second groove portion; 91: first arrow; 92: second arrow; 93: third arrow; 94: fourth arrow; 95: fifth arrow; 96: sixth arrow; 97: seventh arrow; 98: eighth arrow; 100: silicon carbide epitaxial substrate; 101: first direction; 102: second direction; 103: third direction; 104: fourth direction; 111: maximum diameter; 121: central portion; 122, 126: central region; 123, 125: outer peripheral region; 124: outer edge; 127: intermediate region; 131: drift region; 132: body region; 133: source region; 134: contact region; 136: oxide film; 137: interlayer insulating film; 138: interconnection layer; 141: first electrode; 142: second electrode; 143: third electrode; 200: film forming device; 201: reaction chamber; 202: preheating structure; 204: quartz tube; 205: heat insulator; 206: induction heating coil; 207: gas inlet; 208: gas outlet; 210: susceptor plate; 211: first base member; 212: first coat portion; 213: decomposition point; 220: heating element; 221: first region; 222: second region; 223: third region; 225: second base member; 226: second coat portion; 300: silicon carbide semiconductor device.

The invention claimed is:

1. A silicon carbide epitaxial substrate, comprising:
  a silicon carbide single crystal substrate having a first main surface; and
  a silicon carbide layer on the first main surface,
  the silicon carbide layer including a second main surface opposite to a surface thereof in contact with the silicon carbide single crystal substrate,
  the second main surface having a maximum diameter of more than or equal to 100 mm,
  the second main surface including an outer peripheral region which is within 3 mm from an outer edge of the second main surface, and a central region surrounded by the outer peripheral region,
  the central region having a haze of more than or equal to 20 ppm and less than or equal to 75 ppm.

2. The silicon carbide epitaxial substrate according to claim 1, wherein the second main surface is a (0001) plane, or a plane inclined from the (0001) plane by less than or equal to 8°.

3. The silicon carbide epitaxial substrate according to claim 2, wherein
  in a direction parallel to the second main surface, a ratio of a standard deviation of a carrier concentration to an average value of the carrier concentration in the silicon carbide layer is less than or equal to 4%, and
  the average value is less than or equal to $2 \times 10^{16}$ cm$^{-3}$.

4. The silicon carbide epitaxial substrate according to claim 2, wherein a groove portion is present in the second main surface, the groove portion extending in one direction along the second main surface, having a width in the one direction which is twice or more a width thereof in a direction perpendicular to the one direction, and having a maximum depth from the second main surface of less than or equal to 10 nm.

5. The silicon carbide epitaxial substrate according to claim 4, wherein the groove portion includes a first groove portion, and a second groove portion connected to the first groove portion, the first groove portion is at one end portion of the groove portion in the one direction, and the second groove portion extends from the first groove portion along the one direction to reach the other end portion opposite to the one end portion, and has a depth from the second main surface which is smaller than a maximum depth of the first groove portion.

6. The silicon carbide epitaxial substrate according to claim 2, wherein a pit originating from a threading screw dislocation is present in the second main surface, the pit has an area density of less than or equal to 1000 $cm^{-2}$, and within the pit, a maximum depth thereof from the second main surface is more than or equal to 8 nm.

7. The silicon carbide epitaxial substrate according to claim 6, wherein the pit has an area density of less than or equal to 100 $cm^{-2}$.

8. The silicon carbide epitaxial substrate according to claim 6, wherein the pit has an area density of less than or equal to 10 $cm^{-2}$.

9. The silicon carbide epitaxial substrate according to claim 6, wherein the pit has an area density of less than or equal to 1 $cm^{-2}$.

10. The silicon carbide epitaxial substrate according to claim 6, wherein, within the pit, a maximum depth thereof from the second main surface is more than or equal to 20 nm.

11. The silicon carbide epitaxial substrate according to claim 6, wherein the pit has a planar shape including a first width extending in a first direction, and a second width extending in a second direction perpendicular to the first direction, and the first width is twice or more the second width.

12. The silicon carbide epitaxial substrate according to claim 1, wherein the second main surface is a (000-1) plane, or a plane inclined from the (000-1) plane by less than or equal to 8°.

13. The silicon carbide epitaxial substrate according to claim 12, wherein in a direction parallel to the second main surface, a ratio of a standard deviation of a carrier concentration to an average value of the carrier concentration in the silicon carbide layer is less than or equal to 5%, and the average value is less than or equal to $2 \times 10^{16}$ $cm^{-3}$.

14. The silicon carbide epitaxial substrate according to claim 13, wherein the ratio is less than or equal to 3%.

15. The silicon carbide epitaxial substrate according to claim 13, wherein the ratio is less than or equal to 2%.

16. The silicon carbide epitaxial substrate according to claim 13, wherein the ratio is less than or equal to 1%.

17. The silicon carbide epitaxial substrate according to claim 12, wherein in the second main surface, trapezoidal defects, which are trapezoidal depressions, have an area density of less than or equal to 0.5 $cm^{-2}$, the trapezoidal defects each include an upper base portion and a lower base portion intersecting with a <11-20> direction when viewed in plan view, the upper base portion has a width of more than or equal to 0.1 μm and less than or equal to 100 μm, the lower base portion has a width of more than or equal to 50 μm and less than or equal to 5000 μm, the upper base portion includes a protruding portion, and the lower base portion includes a plurality of step bunchings.

18. The silicon carbide epitaxial substrate according to claim 12, wherein, in the second main surface, triangular defects have an area density of less than or equal to 0.5 $cm^{-2}$.

19. The silicon carbide epitaxial substrate according to claim 12, wherein the silicon carbide epitaxial substrate has a bow of less than or equal to 50 μm.

20. The silicon carbide epitaxial substrate according to claim 1, wherein the maximum diameter is more than or equal to 150 mm.

21. The silicon carbide epitaxial substrate according to claim 1, wherein the silicon carbide layer has a thickness of more than or equal to 5 μm.

22. A method for manufacturing a silicon carbide semiconductor device, comprising:

preparing a silicon carbide epitaxial substrate according to claim 1; and processing the silicon carbide epitaxial substrate.

* * * * *